US011568950B2

(12) United States Patent
Park et al.

(10) Patent No.: US 11,568,950 B2
(45) Date of Patent: Jan. 31, 2023

(54) SEMICONDUCTOR DEVICE HAVING MICRO-BUMPS AND TEST METHOD THEREOF

(71) Applicant: SK hynix Inc., Icheon-si (KR)

(72) Inventors: Youngjun Park, Icheon-si (KR); Youngjun Ku, Icheon-si (KR); Junil Moon, Icheon-si (KR); Byungkuk Yoon, Icheon-si (KR); Seokwoo Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 307 days.

(21) Appl. No.: 16/918,926

(22) Filed: Jul. 1, 2020

(65) Prior Publication Data

US 2021/0231732 A1     Jul. 29, 2021

(30) Foreign Application Priority Data

Jan. 29, 2020     (KR) ........................ 10-2020-0010441

(51) Int. Cl.
*G11C 29/32*     (2006.01)
*G01R 31/3177*     (2006.01)
(Continued)

(52) U.S. Cl.
CPC .......... *G11C 29/32* (2013.01); *G01R 31/3177* (2013.01); *G01R 31/31717* (2013.01); *G11C 29/1201* (2013.01)

(58) Field of Classification Search
CPC ..... G11C 29/32; G11C 29/1201; G11C 5/025; G01R 31/31717; G01R 31/3177;
(Continued)

(56) References Cited

U.S. PATENT DOCUMENTS 9,625,523 B2     4/2017 Goel et al.
2012/0126840 A1*    5/2012 Lee ................. G11C 29/1201
324/750.3
(Continued)

FOREIGN PATENT DOCUMENTS

KR     1020120119960 A     11/2012

OTHER PUBLICATIONS

R. Wang, K. Chakrabarty and B. Eklow, "Scan-Based Testing of Post-Bond Silicon Interposer Interconnects in 2.5-D ICs," in IEEE Transactions on Computer-Aided Design of Integrated Circuits and Systems, vol. 33, No. 9, pp. 1410-1423, Sep. 2014. (Year: 2014).*

(Continued)

*Primary Examiner* — Cynthia Britt
(74) *Attorney, Agent, or Firm* — William Park & Associates Ltd.

(57) ABSTRACT

A semiconductor device includes a plurality of first micro-bumps suitable for transferring normal signals; a plurality of a second micro-bumps suitable for transferring test signals; and a test circuit including a plurality of scan cells respectively corresponding to the first and second micro-bumps. The test circuit is suitable for applying signals stored in the respective scan cells to the first and second micro-bumps, feeding back the applied signals from the first and second micro-bumps to the respective scan cells, and sequentially outputting the signals stored in the scan cells to a test output pad.

20 Claims, 17 Drawing Sheets

(51) Int. Cl.
*G11C 29/12* (2006.01)
*G01R 31/317* (2006.01)

(58) Field of Classification Search
CPC ........ G01R 31/318538; G01R 31/2853; G01R 31/2856; G01R 31/2896; G01R 31/318536; G01R 31/3187; H01L 22/34; H01L 22/14; H01L 23/481; H01L 23/49816; H01L 25/0657
See application file for complete search history.

(56) References Cited

U.S. PATENT DOCUMENTS

| | | | |
|---|---|---|---|
| 2012/0272112 A1* | 10/2012 | Oh ........................ | H01L 23/481 |
| | | | 714/E11.155 |
| 2018/0308826 A1* | 10/2018 | Kawaminami ....... | H01L 23/528 |
| 2020/0202910 A1* | 6/2020 | Park ........................ | H01L 24/14 |
| 2021/0190854 A1* | 6/2021 | Oh ...................... | G01R 31/2896 |
| 2021/0265000 A1* | 8/2021 | Yu ...................... | G01R 31/2896 |

OTHER PUBLICATIONS

H. Jun, S. Nam, H. Jin, J. -C. Lee, Y. J. Park and J. J. Lee, "High-Bandwidth Memory (HBM) Test Challenges and Solutions," in IEEE Design & Test, vol. 34, No. 1, pp. 16-25, Feb. 2017. (Year: 2017).*

* cited by examiner

SEMICONDUCTOR DEVICE HAVING MICRO-BUMPS AND TEST METHOD THEREOF

CROSS-REFERENCE TO RELATED APPLICATIONS

The present application claims priority to Korean Patent Application No. 10-2020-0010441, filed on Jan. 29, 2020, which is incorporated herein by reference in its entirety.

BACKGROUND

Field

Various embodiments of the present disclosure relate to semiconductor design technology, and more particularly, to a semiconductor device configured to test connectivity of micro-bumps.

Description of the Related Art

As semiconductor technology makes dramatic progress, semiconductor integrated devices such as packages are required to have a higher degree of integration and performance. To this end, current technology is moving away from a two-dimensional structure in which semiconductor chips are arranged on one plane over a printed circuit board (PCB) by using wires or bumps. Instead, new diverse technologies related to a three-dimensional structure in which a plurality of semiconductor chips are vertically stacked are emerging.

The three-dimensional structure may be implemented by a stacked semiconductor device in which a plurality of semiconductor chips are vertically stacked. The semiconductor chips stacked in a vertical direction are electrically connected to each other through through-electrodes (e.g., through-silicon-vias, TSVs) and mounted on a semiconductor packaging substrate.

For a stacked semiconductor device, a plurality of micro-bumps may be disposed to facilitate physical contact between stacked semiconductor chips. Because various signals are transmitted between the stacked semiconductor chips through through-electrodes TSVs and micro-bumps, tests are needed to determine whether they are connected normally.

SUMMARY

Embodiments of the present disclosure are directed to a semiconductor device capable of evaluating/verifying a connectivity of bumps for a test operation, as well as bumps for normal operation, and a semiconductor system including the same.

In accordance with an embodiment of the present disclosure, a semiconductor device includes a plurality of first micro-bumps suitable for transferring normal signals; a plurality of a second micro-bumps suitable for transferring test signals; and a test circuit including a plurality of scan cells respectively corresponding to the first and second micro-bumps. The test circuit is suitable for applying signals stored in the respective scan cells to the first and second micro-bumps, feeding back the applied signals from the first and second micro-bumps to the respective scan cells, and sequentially outputting the signals stored in the scan cells to a test output pad.

In accordance with an embodiment of the present disclosure, a semiconductor device includes a plurality of first micro-bumps suitable for transferring normal signals; a plurality of second micro-bumps suitable for transferring test signals; a plurality of first testing circuits respectively coupled to the normal bumps; a second testing circuit coupled to at least one test input bump among the second micro-bumps; and a third testing circuit suitable coupled to a test output bump among the second micro-bumps. The first to third testing circuits include a plurality of scan cells respectively coupled to the first and second micro-bumps, and the scan cells form a serial scan chain in the order of the third testing circuit, then the second testing circuit, and then the first testing circuits.

In accordance with an embodiment of the present disclosure, a method for testing a semiconductor device in which a plurality of normal micro-bumps, a plurality of test micro-bumps, and a plurality of scan cells respectively corresponding to the normal micro-bumps and the test micro-bumps, and forming a serial scan chain, are formed, includes sequentially storing signals transferred from a proving area on which a plurality of pads are formed, into the scan cells through the serial scan chain; applying signals stored in the respective scan cells to the corresponding micro-bumps disposed on a bump area; feeding back the applied signals from the micro-bumps to the respective scan cells; and sequentially outputting the signals stored in the scan cells through the serial scan chain, to the pads of the proving area.

These and other features and advantages of the present disclosure will become apparent to those skilled in the art from the following detailed description in conjunction with the following drawings.

DETAILED DESCRIPTION

Figure 1:
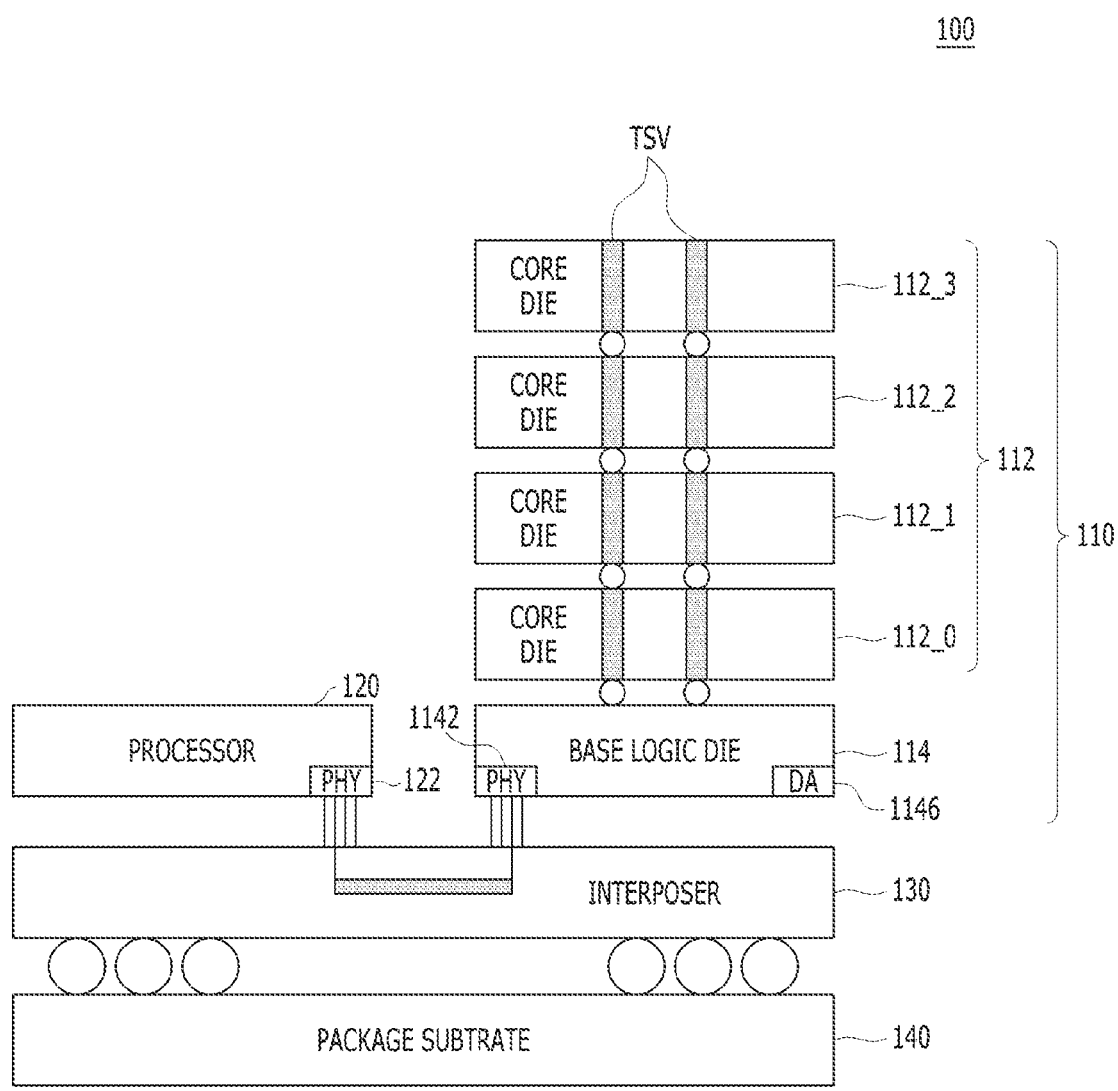
FIG. 1 is a cross-sectional diagram illustrating a semiconductor system in accordance with various embodiments of the present disclosure.

Various embodiments of the present teachings will be described below in more detail with reference to the accompanying drawings. The present teachings may, however, be embodied in different forms and should not be construed as being limited to the embodiments set forth herein. Rather, these embodiments are provided so that this disclosure will convey the scope of the present teachings to those skilled in the art. Throughout the disclosure, like reference numerals refer to like parts throughout the various figures and embodiments of the present teachings.

It is noted that reference to "an embodiment," "another embodiment," or the like does not necessarily mean only one embodiment, and different references to any such phrase are not necessarily to the same embodiment(s).

It will be understood that, although the terms "first," "second," "third," and so on may be used herein to describe various elements, these elements are not limited by these terms. These terms are used to distinguish one element from another element. Thus, a first element described below could also be termed a second or third element without departing from the spirit and scope of the present teachings.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, and vice versa, unless the context clearly indicates otherwise. The articles 'a' and 'an' as used in this application and the appended claims should generally be construed to mean 'one or more' unless specified otherwise or it is clear from context to be directed to a singular form.

Hereinafter, a semiconductor system including a stacked semiconductor device will be described. The semiconductor system in accordance with the embodiment of the present teachings may be embodied in the form of a system-in-package, a multi-chip package, or a system-on-chip, and it may also be embodied in the form of a package-on-package.

FIG. 1 is a cross-sectional diagram illustrating a semiconductor system 100 in accordance with various embodiments of the present teachings.

Referring to FIG. 1, the semiconductor system 100 may include a semiconductor device 110, a controller 120, an interposer 130, and a package substrate 140.

The interposer 130 may be mounted onto the package substrate 140.

The semiconductor device 110 and the controller 120 may be mounted onto the interposer 130.

Because the controller 120 is generally included in diverse processors, such as a Central Processing Unit (CPU), a Graphic Processing Unit (GPU), and an Application Processor (AP), the controller 120 may be also referred to as a processor as designated in FIG. 1.

A physical area (PHY) 1142 of the stacked semiconductor device 110 may be coupled to a physical area (PHY) 122 of the controller 120 via the interposer 130. An interface circuit for communication between the stacked semiconductor device 110 and the controller 120 may be disposed in each of the physical areas 1142 and 122.

The stacked semiconductor device 110 may form a High Bandwidth Memory (HBM). The HBM may have a high bandwidth corresponding to the increased number of I/O units resulting from stacking a plurality of dies (i.e., semiconductor chips) in a vertical direction and electrically connecting them through through-electrodes TSVs.

The plurality of dies may include a base logic die 114 and a plurality of core dies 112. The core dies 112 may be sequentially stacked over the base logic die 114, and coupled to each other through the through-electrodes TSVs. Although FIG. 1 shows that four core dies 112, that is, first to fourth core dies 112_0 to 112_3, are stacked, the concept and spirit of the present teachings are not limited thereto and the number of the stacked core dies may vary depending on the design of the semiconductor device.

Each of the core dies 112 may be implemented with a memory chip. Each of the core dies 112 may include a plurality of memory cells for storing data and circuits for supporting a core operation on the memory cells. The base logic die 114 may act as an interface between the core dies 112 and the controller 120 so that various functions within the semiconductor system 100, such as a memory management function (e.g., a refresh management function and a power management function for the memory cells), and a timing adjustment function between the core dies 112 and the controller 120, may be performed.

Meanwhile, the base logic die 114 may include the physical area 1142 and a direct access area (DA) 1146. In the physical area 1142, an interface circuit for communication with the controller 120 may be disposed. In the direct access area 1146, an interface circuit for directly testing the stacked semiconductor device 110 may be disposed. The base logic die 114 is also referred to as a buffer die.

Figure 2:
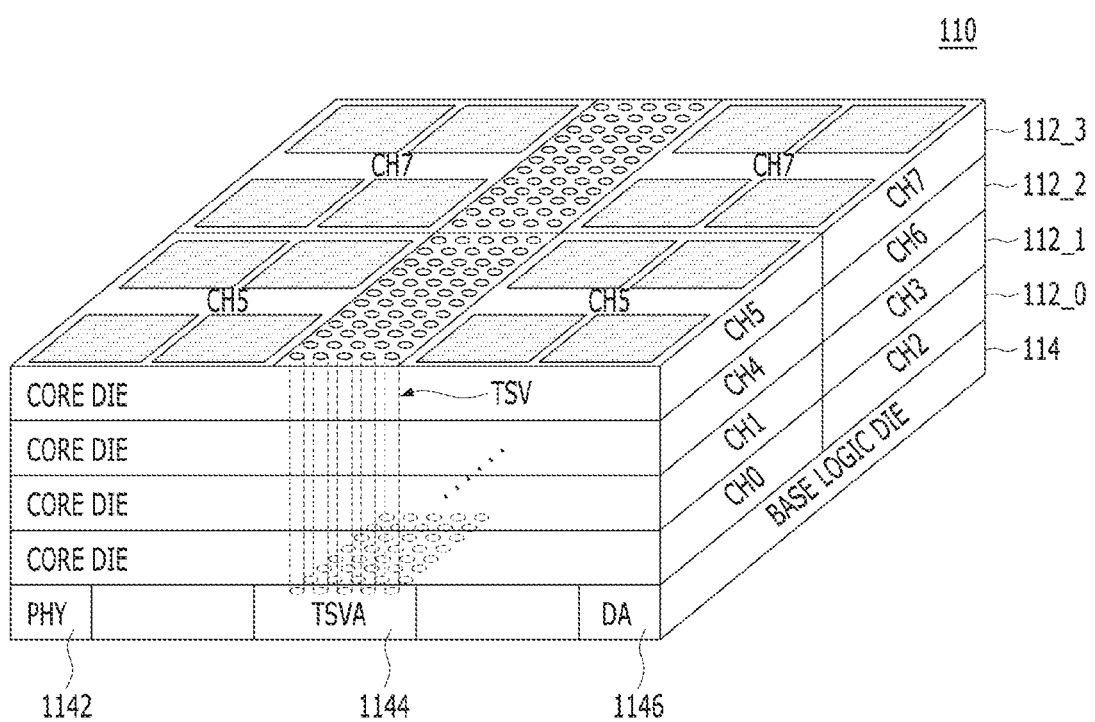
FIG. 2 is a perspective view illustrating a stacked semiconductor device shown in FIG. 1.

FIG. 2 is a perspective view of the stacked semiconductor device 110 shown in FIG. 1.

Referring to FIG. 2, each of the first to fourth core dies 112_0 to 112_3 may include one or more channels. In the example of FIG. 2, as one core die includes two channels, the stacked semiconductor device 110 may have first to eighth channels CH0 to CH7. For example, the first core die 112_0 may include memory areas corresponding to the first and third channels CH0 and CH2, and the second core die 112_1 may include memory areas corresponding to the second and fourth channels CH1 and CH3. The third core die 112_2 may include memory areas corresponding to the fifth and seventh channels CH4 and CH6, and the fourth core die 112_3 may include memory areas corresponding to the sixth and eighth channels CH5 and CH7.

For example, first to eighth memory banks may correspond to each channel. Further, a plurality of through-electrodes TSVs passing through the first to fourth core dies 112_0 to 112_3 may be disposed corresponding to the first to eighth channels CH0 to CH7, respectively. When each channel has a bandwidth of 128 bits (i.e., two 128-bit channels per die), the through-electrodes TSVs and corresponding I/O units may be configured to transfer 1024 bits of data. Each channel may be similar to a standard DDR interface, but may be completely independent and therefore each channel within one stacked semiconductor device and even within one die may operate at a different frequency and/or different timings.

The base logic die 114 may communicate with the controller 120 (see FIG. 1). For example, the base logic die 114 may receive commands, addresses, and data from the controller 120, and provide the received commands, addresses, and data to the first to fourth core dies 112_0 to 112_3.

A physical area (PHY) 1142, a TSV area (TSVA) 1144, and a direct access area (DA) 1146 may be disposed in the base logic die 114. The physical area (PHY) 1142 may be the same part as the physical area (PHY) 1142 shown in FIG. 1, and the direct access area (DA) 1146 may be the same part as the direct access area (DA) 1146 shown in FIG. 1.

The physical area 1142 may be provided with an I/O circuit for interfacing with the controller 120. The physical area 1142 may be disposed in a first edge area of the base logic die 114, adjacent to the controller 120. The direct access area 1146 may be provided with an I/O circuit for directly interfacing with an external test device (not shown). The direct access area 1146 may be disposed in a second edge area of the base logic die 114, adjacent to the external test device. The second edge area may be disposed in a direction which is opposite to the first edge area. The TSV area 1144 may be an area for interfacing with the through-electrodes TSVs passing through the first to fourth core dies 112_0 to 112_3. The TSV area 1144 may be disposed between the physical area 1142 and the direct access area 1146, that is, the TSV area 1144 may be disposed at the central area of the base logic die 114.

The physical area 1142 may transfer signals received from the controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 to transfer the buffered signals to the first to fourth core dies 112_0 to 112_3 through the through-electrodes TSVs.

Figure 3:
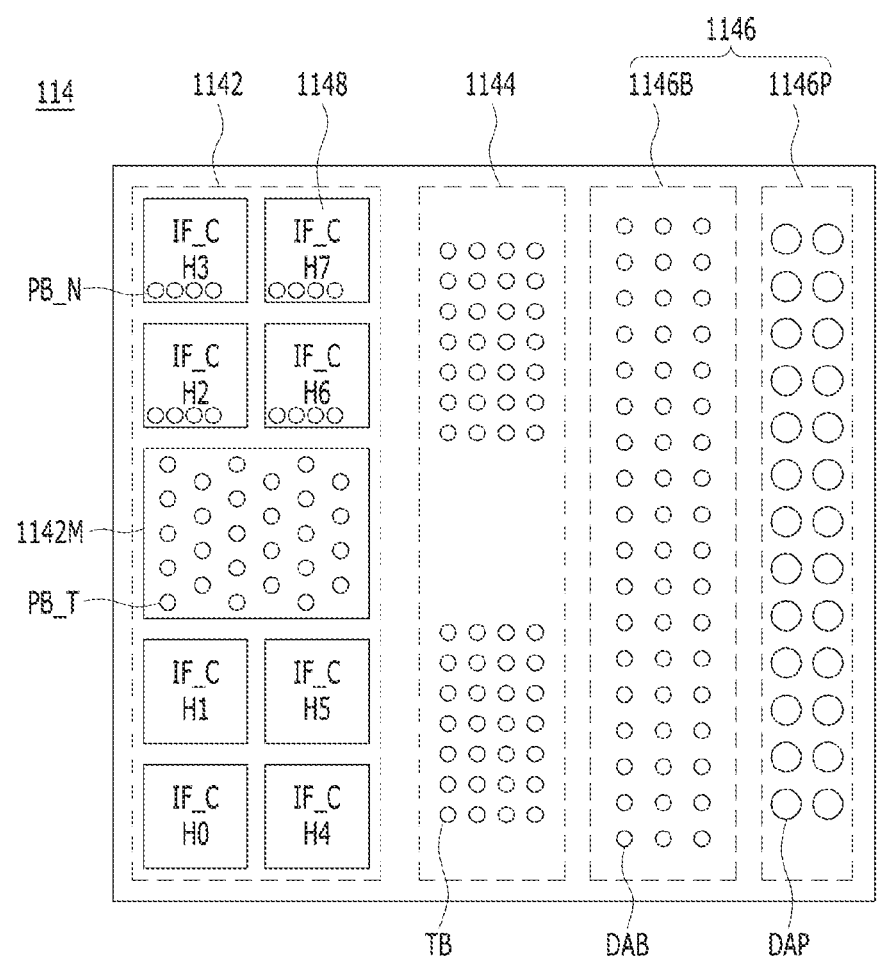
FIG. 3 is a plane view for describing bumps disposed on a base logic die shown in FIG. 2.

FIG. 3 is a plane view for describing bumps disposed on the base logic die 114 shown in FIG. 2.

Referring to FIG. 3, the physical area 1142, the TSV area 1144, and the direct access area 1146 may be disposed in the base logic die 114.

In the physical area 1142, channel interface areas IF_CH0 to IF_CH7 for interfacing with the first to eighth channels CH0 to CH7 of the first to fourth core dies 112_0 to 112_3, and a middle physical area MID_PHY for interfacing with the direct access area 1146 may be disposed. In the channel interface areas IF_CH0 to IF_CH7, a plurality of PHY bumps PB_N may be formed to interface with the controller 120. In the middle physical area MID_PHY, a plurality of PHY bumps PB_T may be formed to interface with the direct access area 1146.

In the TSV area 1144, a plurality of TSV bumps TB may be formed to interface with the through-electrodes TSVs.

In The direct access area 1146, a DA bump area 1146B and a DA probing area 1146P may be disposed. In the DA bump area 1146B, a plurality of DA bumps DAB for interfacing with the external test device through the interposer 130 to test the stacked semiconductor device 110, may be formed on the direct access area 1146. In the DA probing area 1146P, a plurality of DA pads DAP for interfacing with the external test device without going through the interposer 130 to test the stacked semiconductor device 110, may be formed on the direct access area 1146. That is, the external test device may directly access the stacked semiconductor device 110 using the DA bumps DAB or the DA pads DAP. The DA bumps DAB may be provided to test the stacked semiconductor device 110 at a package level, and the DA pads DAP may be provided to test the stacked semiconductor device 110 at a wafer level. For reference, a wafer-level test operation may include a test operation on the stacked semiconductor device 110 composed of the base logic die 114 and the core die 112, and a package-level test operation may include a test operation on the stacked semiconductor device 110 and the controller mounted onto the interposer 130. The PHY bumps PB and the DA bumps DB may be formed of micro-bumps, and the DA pads DAP may be formed of pad larger than the micro-bumps. For example, the DA pads DAP may be relatively larger in physical size but fewer in number than the PHY bumps PB and the DA bumps DB.

Meanwhile, a system vendor may require a mode of directly inputting data to a core die without going through the controller 120 in order to evaluate only the characteristics of the memory areas of the respective core dies 112_0 to 112_3. In short, a test operation may be performed by entering a direct access (DA) mode to test memory cells in a memory area corresponding to each channel. In the DA mode, a test signal may be applied to the DA bumps DAB or the DA pads DAP of the direct access area 1146, and then, the test signal may be transferred to the physical area 1142, in particular, to the middle physical area MID_PHY, from the direct access area 1146. Finally, the test signal may be transferred to the respective core dies 112_0 to 112_3 through the TSV bumps TB and the through-electrodes TSVs of the TSV area 1144, from an interface circuit of the middle physical area MID_PHY.

Hereinafter, PHY bumps PB_N in the channel interface areas IF_CH0 to IF_CH7 may be defined as bumps for a normal operation (referred to as "normal bumps"), and PHY bumps PB_T in the middle physical area MID_PHY and DA bumps DAB in the direct access area 1146 may be defined as bumps for a test operation (referred to as "test bumps"). The normal operation may include a read operation, a write operation, and so on.

Because the physical size of the test bumps PB_T and DAB is very small and the number of the test bumps PB_T and DAB is very large, that is, approximately 1000 or more, it is practically difficult to test the stacked memory device 110 by using the test bumps PB_T and DAB. It is even more difficult to test the stacked memory device 110 by using the normal bumps PB_N when the stacked memory device 110 communicates with the controller 120 in the form of a System-In-Package (SIP). For this reason, the stacked memory device 110 may be tested by using the DA pads DAP that are relatively larger in physical size and relatively fewer in number than the test bumps PB_T and DAB and the normal bumps PB_N.

Meanwhile, the stacked memory device 110 currently tests a connectivity and speed characteristics of the normal bumps PB_N by using a test circuit (e.g., a boundary scan test circuit) according to IEEE 1500 standard for embedded core testing. At this time, control signals for a package-level test operation may be inputted through the test bumps PB_T and DAB, while control signals for test at a wafer-level test operation may be inputted through the DA pads DAP.

Figure 4:
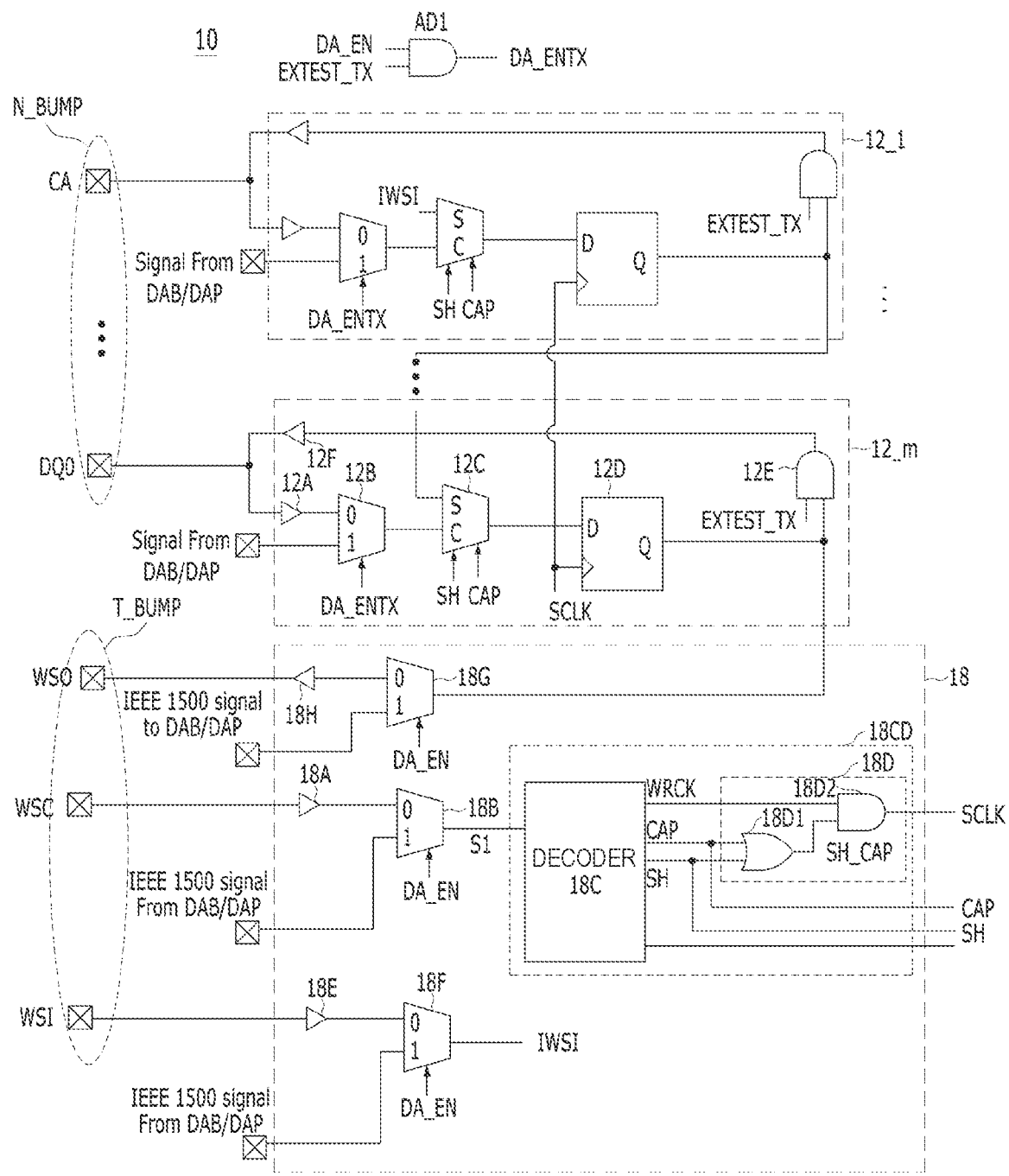
FIG. 4 is a circuit diagram illustrating a semiconductor device in accordance with a first embodiment of the present disclosure.
Figure 5:
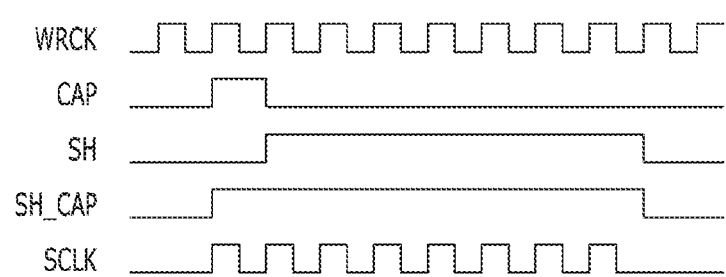
FIG. 5 is a timing diagram for explaining signals generated from a mode control circuit shown in FIG. 4.

FIG. 4 is a circuit diagram illustrating a semiconductor device 10 in accordance with a first embodiment of the present teachings. FIG. 5 is a timing diagram for explaining signals generated from a mode control circuit 18CD shown in FIG. 4.

Referring to FIG. 4, a plurality of first micro-bumps N_BUMP and a plurality of second micro-bumps T_BUMP may be disposed in the semiconductor device 10. The first micro-bumps N_BUMP may correspond to the normal bumps PB_N of FIG. 3, and may transfer signals (referred to as "normal signals") for a normal operation, such as a command/address CA and input/output (I/O) data DQ0 to DQn. The second micro-bumps T_BUMP may correspond to the test bumps PB_T of FIG. 3, and may transfer signals (referred to as "test signals") for a test operation, such as a serial input signal WSI, a test control signal WSC and a serial output signal WSO. The serial input signal WSI, the test control signal WSC, and the serial output signal WSO may be signals used in IEEE 1500 standard for embedded core testing. The test control signal WSC may be composed of multi-bits. (see 1500 IEEE Standard Testability Method for Embedded Core-based Integrated Circuits, Test Technology Technical Committee of the IEEE Computer Society, which is fully incorporated herein by reference). Though FIG. 4 shows one bump receiving the test control signal WSC, a plurality of bumps may be provided to receive the test control signal WSC of multi-bits. The serial input signal WSI and the test control signal WSC are dedicated for input, and the serial output signal WSO is dedicated for output.

The semiconductor device 10 may include a plurality of test circuits 12_1 to 12_m and 18. The test circuits 12_1 to 12_m and 18 may include a plurality of driving circuits 12_1 to 12_m and a test control circuit 18. The driving circuits 12_1 to 12_m may be allocated to each of the first micro-bumps N_BUMP, and the test control circuit 18 may be allocated to the second micro-bumps T_BUMP.

The test control circuit 18 may transfer the test signals WSI, WSC, and WSO through the second micro-bumps T_BUMP, or signals through DA pads DAP or DA bumps DAB, according to a mode signal DA_EN. The mode signal DA_EN may be activated to transfer the signals through the DA pads DAP or DA bumps DAB from a direct access area (1146 of FIG. 3). The signals are transferred through the DA pads DAP during a wafer-level test operation, and transferred through the DA bumps DAB during a package-level test operation. hereinafter, the DA pads DAP or DA bumps DAB are referred to as DA bumps/pads DAB/DAP.

The test control circuit 18 may include input circuits 18A and 18E, input multiplexers 18B and 18F, a mode control circuit 18CD, an output demultiplexer 18G, and an output circuit 18H. The input circuits 18A and 18E may be implemented with a receiver or an input buffer, and the output circuit 18H may be implemented with a transmitter or an output driver. However, the present teachings are not limited to this, and the input circuits 18A and 18E and the output circuit 18H can be implemented in various forms of input/output circuits.

The input circuits 18A and 18E may receive the test signals WSI and WSC through the second micro-bumps T_BUMP, to transfer the received signals to the input multiplexers 18B and 18F, respectively. The input multiplexers 18B and 18F may select the test signals WSI and WSC transferred from the input circuits 18A and 18E, or the signals transferred through the bumps/pads DAB/DAP, according to the mode signal DA_EN. The input multiplexer 18B may select the signal transferred through the bumps/pads DAB/DAP, and output a selected signal S1 to the mode control circuit 18CD, when the mode signal DA_EN is activated. The input multiplexer 18F may select the signal transferred through the bumps/pads DAB/DAP, and output a serial input signal IWSI to a driving circuit (i.e., 12_1) at a first stage among the driving circuits 12_1 to 12_m, when the mode signal DA_EN is activated.

The mode control circuit 18CD may decode the selected signal S1 from the input multiplexer 18B, and generate a capture signal CAP, a shifting signal SH and a shifting clock SCLK. The mode control circuit 18CD may include a decoder 18C and a clock generator 18D. The decoder 18C may decode the selected signal S1 to generate the capture signal CAP, the shifting signal SH and a source clock WRCK. The clock generator 18D may generate the shifting clock SCLK based on the capture signal CAP, the shifting signal SH and the source clock WRCK. The clock generator 18D may include an OR gate 18D1 which performs a logic OR operation on the capture signal CAP and the shifting signal SH to output an intermediate signal SH_CAP, and an AND gate 18D2 which performs a logic AND operation on the intermediate signal SH_CAP and the source clock WRCK to output the shifting clock SCLK. Referring to FIG. 5, the decoder 18C may the capture signal CAP that is activated for one cycle of the source clock WRCK and the shifting signal SH that is activated during a certain interval, synchronizing with a deactivation of the capture signal CAP. The clock generator 18D may generate the intermediate signal SH_CAP that is activated when the capture signal CAP or shifting signal SH is activated, to output the source clock WRCK as the shifting clock SCLK during an activation section of the intermediate signal SH_CAP.

The output demultiplexer 18G may selectively output signals outputted from a driving circuit 12_m at a last stage among the driving circuits 12_1 to 12_m, according to the mode signal DA_EN. The output demultiplexer 18G may output the signals from the driving circuit 12_m to the bumps/pads DAB/DAP when the mode signal DA_EN is activated. The output circuit 18H may output the signals from the output demultiplexer 18G to the second micro-bumps T_BUMP as the serial output signal WSO.

The driving circuits 12_1 to 12_m may transfer the normal signals CA and DQ0 to DQn through the first micro-bumps N_BUMP, or signals through the DA bumps/pads DAB/DAP, according to a first control signal DA_ENTX. The first control signal DA_ENTX may be activated when both the mode signal DA_EN and a first test signal EXTEST_TX are activated. The first control signal DA_ENTX may be generated by an AND gate AD1 for performing a logic AND operation on the mode signal DA_EN and the first test signal EXTEST_TX. The first test signal EXTEST_TX may be activated to apply signals stored in scan cells to the first micro-bumps N_BUMP during the connectivity test operation for bumps. The driving circuits 12_1 to 12_m may select the serial input signal IWSI provided from the test control circuit 18, or the transferred signals through the DA bumps/pads DAB/DAP or the first micro-bumps N_BUMP, and store the selected signal into the scan cells thereof, in response to the capture signal CAP, the shifting signal SH, and the shifting clock SCLK. The driving circuits 12_1 to 12_m may apply the signals stored in the scan cells to the first micro-bump N_BUMP, in response to the first test signal EXTEST_TX.

The driving circuits 12_1 to 12_m may have substantially the same configuration with each other. For example, the driving circuit 12_m may include an input circuit 12A, a first multiplexer 12B, a second multiplexer 12C, a scan cell 12D, a test application circuit 12E, and an output circuit 12F.

The input circuit 12A may receive the normal signal DQ0 through the first micro-bump N_BUMP. The first multiplexer 12B may select the normal signal DQ0 provided from the input circuit 12A, or the signal transferred through the DA bump/pad DAB/DAP, according to the first control signal DA_ENTX. The first multiplexer 12B may select the signal transferred through the DA bump/pad DAB/DAP when the first control signal DA_ENTX is activated. The second multiplexer 12C may select a signal transferred from a driving circuit 12_m–1 at a previous stage, or a signal transferred from the first multiplexer 12B, according to the capture signal CAP and the shifting signal SH. The second multiplexer 12C may select the signal transferred from the previous driving circuit when the shifting signal SH is activated, and may select the signal transferred from the first multiplexer 12B when the capture signal CAP is activated. The scan cell 12D may store the selected from the second multiplexer 12C according to the shifting clock SCLK. Preferably, the scan cell 12D may be composed of D-flip-flop. The test application circuit 12E may apply the signal stored in the scan cell 12D to the output circuit 12F, when the first test signal EXTEST_TX is activated. The output circuit 12F may output the applied signal from the test application circuit 12E to the first micro-bump N_BUMP.

Meanwhile, the signals transferred through the DA bumps/pads DAB/DAP, may be available for the connectivity test operation for bumps.

Figure 6:
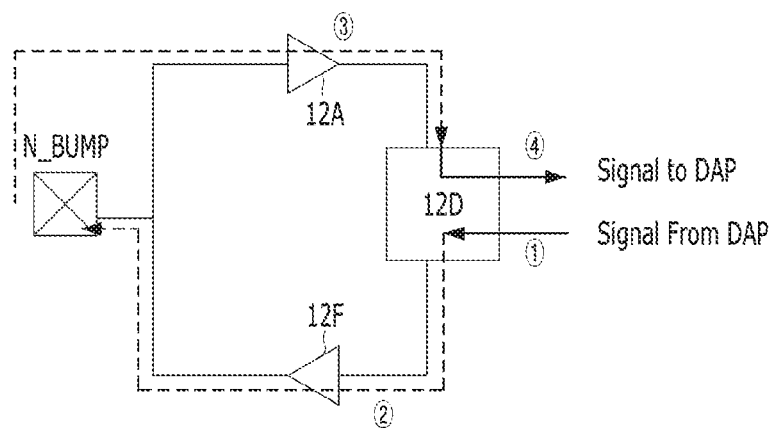
FIG. 6 is a conceptual diagram to describe a connectivity test operation for bumps.

FIG. 6 is a conceptual diagram to describe a connectivity test operation for bumps.

Referring to FIG. 6, the connectivity test operation for bumps at a wafer level is shown, as an example. The signals transferred through the DA pads DAP are stored into the scan cell 12D of each of the driving circuits 12_1 to 12_m (see ①). The stored signals are transferred from the scan cells 12D to the first micro-bumps N_BUMP through the output circuit 12F (see ②). That is, the stored signals of the scan cells 12D are applied to the first micro-bumps N_BUMP.

Thereafter, the signals applied to the first micro-bumps N_BUMP are stored again in the scan cell 12D of each of the driving circuits 12_1 to 12_m, through the input circuit 12A (see ③). The signals stored in the scan cells 12D are sequentially shifted and outputted to the DA pad DAP through the output demultiplexer 18G of the test control circuit 18 (see ④). An external test device may determine the connectivity of bumps by monitoring the signals outputted from the DA pad DAP.

Hereinafter, referring to FIGS. 4 to 8C, a test operation of the semiconductor device 10 will be described in detail. In FIGS. 7A to 8C, some parts of the semiconductor device 10 are shown.

Figure 7A:
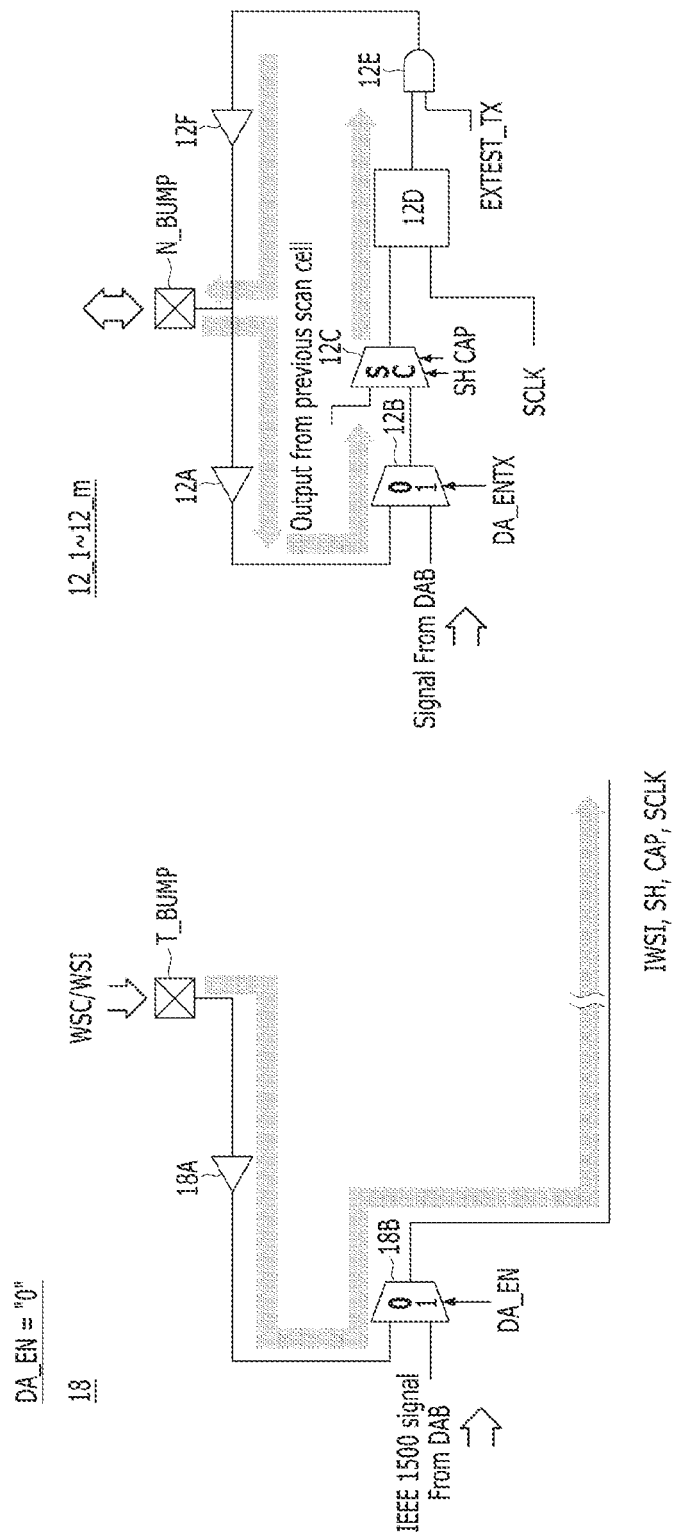
FIGS. 7A and 7B are diagrams for describing a package-level test operation of the semiconductor device shown in FIG. 4.
Figure 7B:
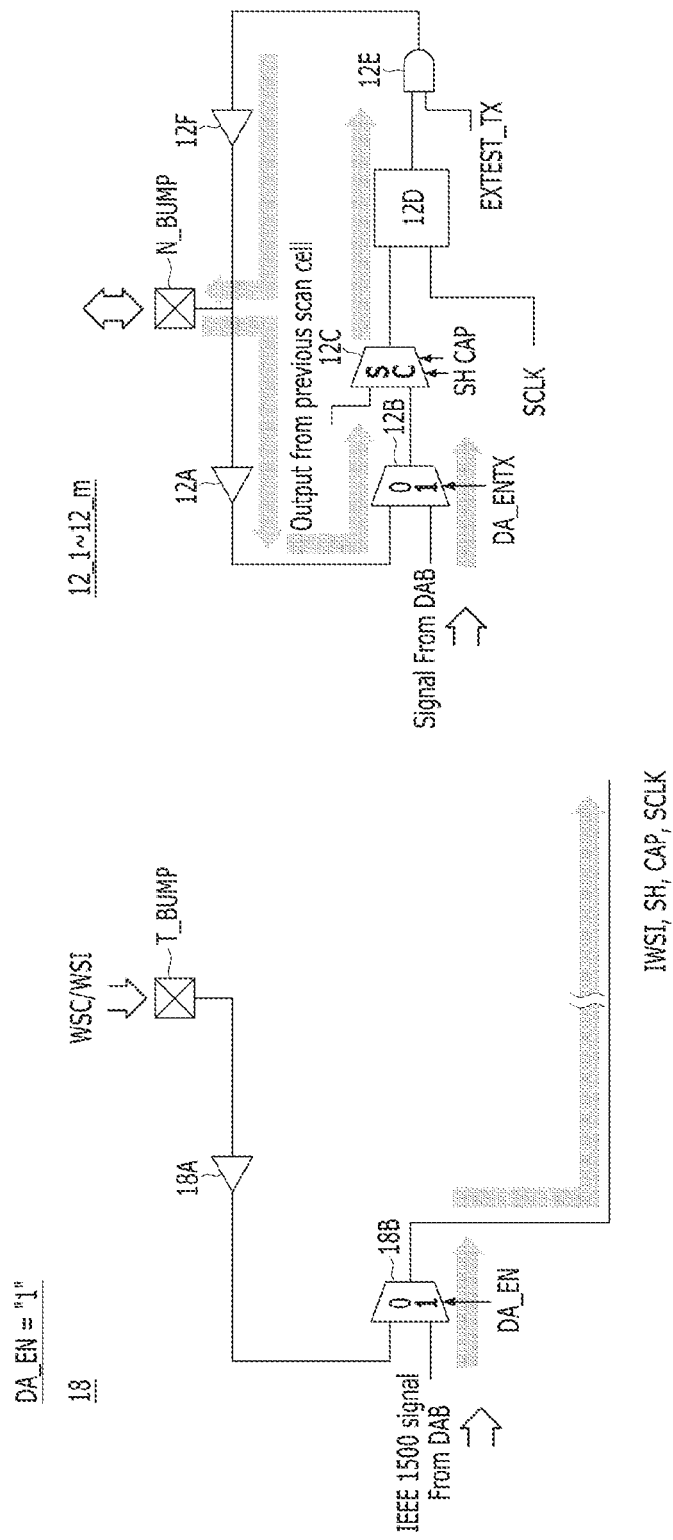

FIGS. 7A and 7B are diagrams for describing a package-level test operation of the semiconductor device 10 shown in FIG. 4.

The package-level test operation may include the connectivity test operation for bumps of FIG. 6. In the package-level test operation, signals are transferred through the first micro-bumps N_BUMP and the second micro-bumps T_BUMP, or transferred through the DA bumps DAB.

Referring to FIG. 7A, in case where the mode signal DA_EN is deactivated, the semiconductor device 10 may perform a normal operation or a test operation using the signals that are transferred through the first micro-bumps N_BUMP and the second micro-bumps T_BUMP from the controller (120 of FIG. 1). During the test operation, the test control circuit 18 receives the test signals WSI and WSC through the second micro-bumps T_BUMP, and generate the serial input signal IWSI, the capture signal CAP, the shifting signal SH, and the shifting clock SCLK. In response to the shifting signal SH and the shifting clock SCLK, the driving circuits 12_1 to 12_m may sequentially store an output signal of the scan cell 12D at the previous driving circuit (corresponding to the serial input signal IWSI), into the scan cells 12D. In response to the capture signal CAP and the shifting clock SCLK, the driving circuits 12_1 to 12_m may simultaneously store the signals inputted through the first micro-bumps N_BUMP, into the scan cells 12D. The driving circuits 12_1 to 12_m may output the signals stored in the scan cells 12D to the second micro-bumps T_BUMP as the serial output signal WSO. The controller 120 may monitor the semiconductor device 10 based on the serial output signal WSO.

Referring to FIG. 7B, in case where the mode signal DA_EN is activated, the semiconductor device 10 may perform a test operation using the signals that are transferred through the DA bumps DAB from a test device (not shown). The test control circuit 18 receives the signals through the DA bumps DAB, and generate the serial input signal IWSI, the capture signal CAP, the shifting signal SH, and the shifting clock SCLK. In response to the shifting signal SH and the shifting clock SCLK, the driving circuits 12_1 to 12_m may sequentially store an output signal of the scan cell 12D at the previous driving circuit (corresponding to the serial input signal IWSI), into the scan cells 12D. In response to the capture signal CAP and the shifting clock SCLK, the driving circuits 12_1 to 12_m may simultaneously store the signals inputted through the DA bumps DAB, into the scan cells 12D. The driving circuits 12_1 to 12_m may output the signals stored in the scan cells 12D to the DA bumps DAB. The test device may monitor the semiconductor device 10 based on the signal outputted through the DA bumps DAB.

Figure 8A:
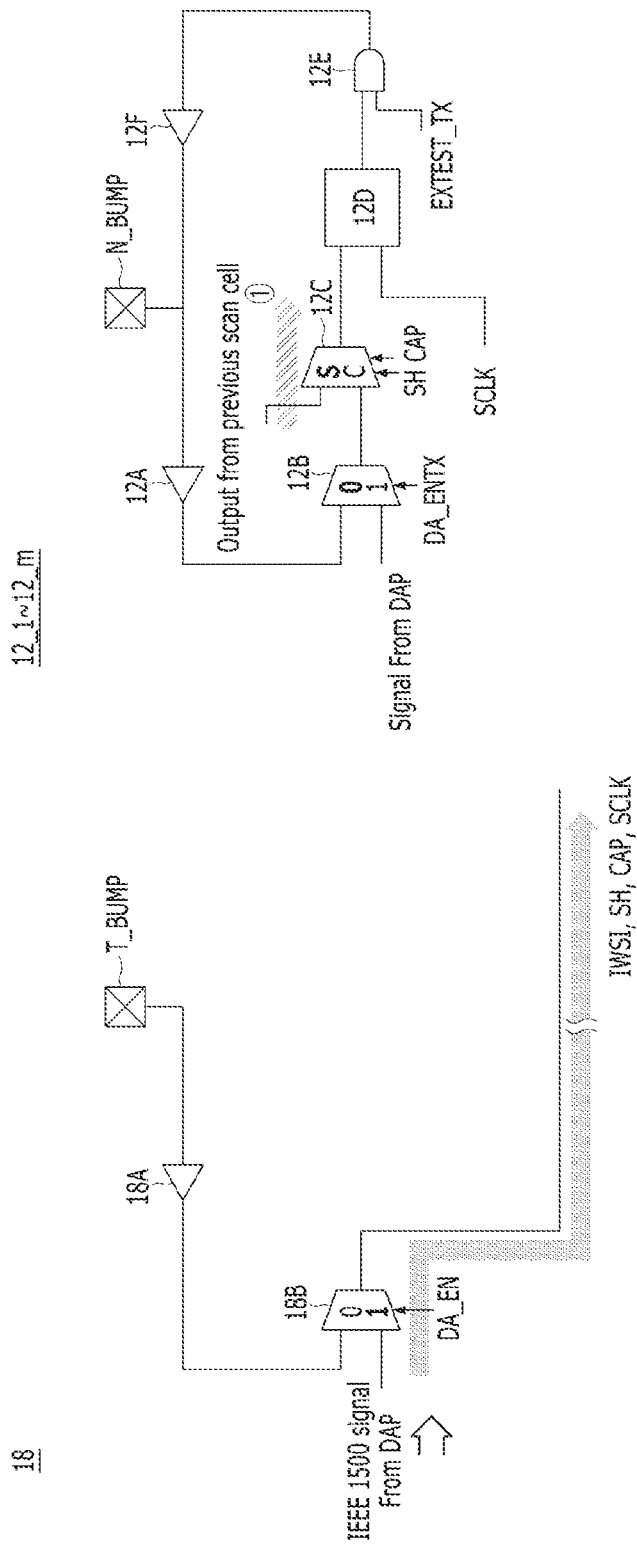
FIGS. 8A to 8C are diagrams for describing a wafer-level test operation of the semiconductor device shown in FIG. 4.
Figure 8B:
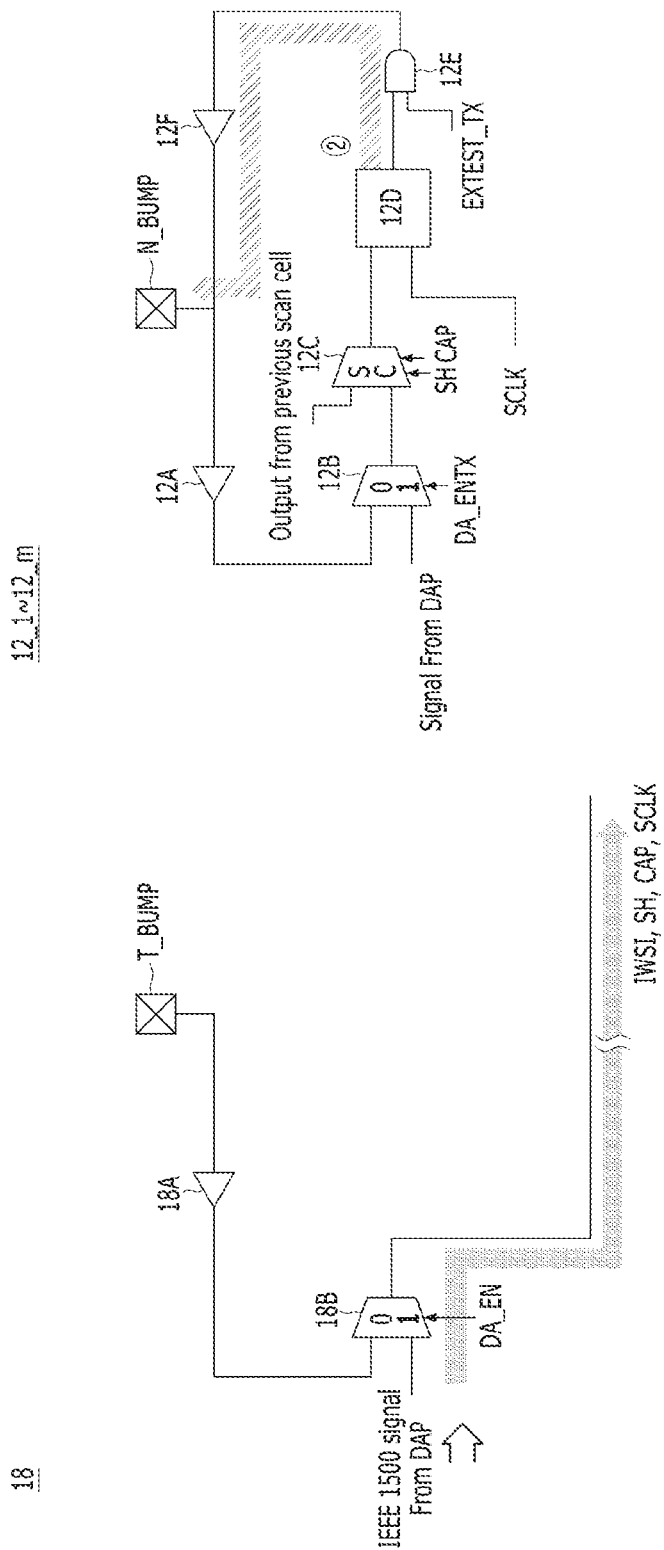
Figure 8C:
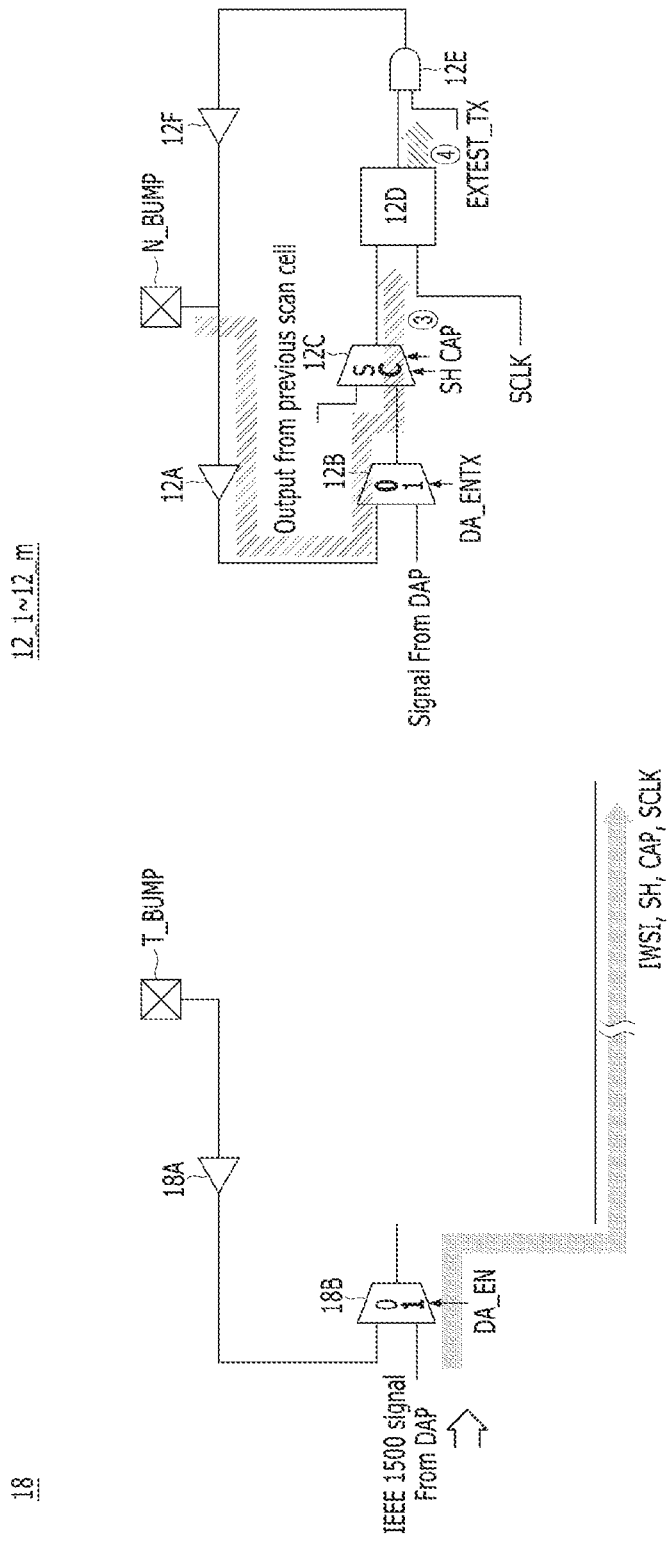

FIGS. 8A to 8C are diagrams for describing a wafer-level test operation of the semiconductor device 10 shown in FIG. 4.

The wafer-level test operation may include the connectivity test operation for bumps of FIG. 6. In FIGS. 8A to 8C, the DA bumps DAB, the first micro-bumps N_BUMP and the second micro-bumps T_BUMP might not be used at the wafer level, so that signals are inputted/outputted through only the DA pads DAP. For reference, the package-level test operation of FIG. 7B in case where the mode signal DA_EN is activated may be performed in substantially the same way as the wafer-level test operation, except that signals are inputted/outputted through the DA pads DAP.

Referring to FIG. 8A, when the mode signal DA_EN is activated, the test control circuit 18 may receive the signals inputted through the DA pads DAP and generate the serial input signal IWSI, the capture signal CAP, the shifting signal SH, and the shifting clock SCLK. In response to the shifting signal SH and the shifting clock SCLK, the driving circuits 12_1 to 12_m may sequentially store an output signal of the scan cell 12D at the previous driving circuit (or the serial input signal IWSI), into the scan cells 12D (see ①).

Referring to FIG. 8B, as the first test signal EXTEST_TX is activated, the stored signals are transferred from the scan cells 12D to the first micro-bumps N_BUMP through the output circuit 12F (see ②). That is, the stored signals of the scan cells 12D are applied to the first micro-bumps N_BUMP.

Referring to FIG. 8C, because the first test signal EXTEST_TX is deactivated, the first control signal DA_E-NTX becomes inactivated. In response to the capture signal CAP and the shifting clock SCLK, the signals applied to the first micro-bumps N_BUMP are stored again in the scan cell 12D of each of the driving circuits 12_1 to 12_m, through the input circuit 12A (see ③). Finally, according to the shifting signal SH and the shifting clock SCLK, the signals stored in the scan cells 12D are sequentially shifted and outputted to the DA pad DAP through the output demultiplexer 18G of the test control circuit 18 (see ④). An external test device may determine whether the connectivity of bumps is pass or fail by monitoring the signal outputted from the DA pad DAP.

Meanwhile, the first micro-bumps N_BUMP for the normal operation may be evaluated through the above test operation. However, because the above test operation is performed on the premise of integrity for the second micro-bumps T_BUMP for the test operation, it is difficult to accurately test the semiconductor device if a defect exists in the second micro-bumps T_BUMP. Thus, it is required to evaluate the second micro-bumps T_BUMP for the test operation. Hereinafter, in a second embodiment, a method for evaluating/verifying test micro-bumps T_BUMP using DA pads DAP will be described. The test micro-bumps T_BUMP may include the PHY bumps PB_T disposed in the middle physical area MID_PHY and the DA bumps DAB disposed in the DA area 1146 of FIG. 3.

Figure 9:
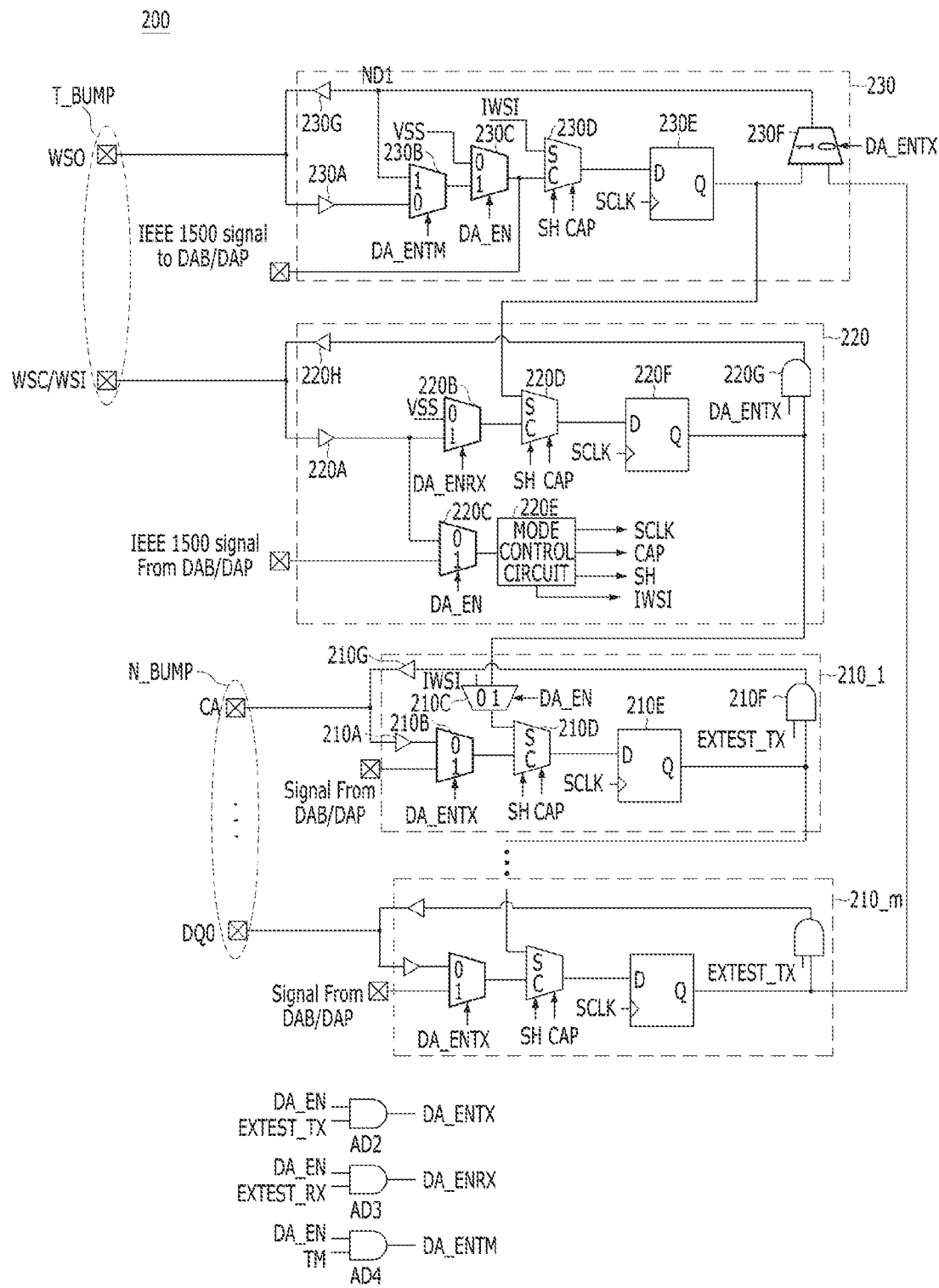
FIG. 9 is a circuit diagram illustrating a semiconductor device in accordance with a second embodiment of the present disclosure.

FIG. 9 is a circuit diagram illustrating a semiconductor device 200 in accordance with a second embodiment of the present teachings.

Referring to FIG. 9, a plurality of first micro-bumps N_BUMP for transferring signals used in a normal operation, and a plurality of second micro-bumps T_BUMP for transferring signals used in a test operation, may be disposed in the semiconductor device 200. The first micro-bumps N_BUMP and the second micro-bumps T_BUMP are substantially the same as those of FIG. 4. The second micro-bumps T_BUMP may include at least one test input bump for receiving a serial input signal WSI and a test control signal WSC, and a test output bump for outputting a serial output signal WSO. For the convenience of explanation, in FIG. 9, the serial input signal WSI and the test control signal WSC are illustrated as being inputted to one bump, but they can be inputted via dedicated bumps, respectively.

The semiconductor device 200 may include a test circuit 210_1 to 210_m, 220 and 230. The test circuit 210_1 to 230 may include a plurality of first testing circuits 210_1 to 210_m, a second testing circuit 220, and a third testing circuit 230. The first testing circuits 210_1 to 210_m may correspond to the first micro-bumps N_BUMP, respectively. The second testing circuit 220 and the third testing circuit 230 may correspond to the second micro-bumps T_BUMP, respectively. The test circuit 210_1 to 230 may include a plurality of scan cells 210E, 220F, and 230E, each scan cell corresponding to the first micro-bumps N_BUMP and the second micro-bumps T_BUMP, one-by-one. At this time, the scan cells 210E to 230E may form a serial scan chain in the order of the third testing circuit 230, the second testing circuit 220 and the first testing circuits 210_1 to 210_m.

The test circuit 210_1 to 230 may sequentially store signals transferred through DA bumps/pads DAB/DAP using the serial scan chain, apply the signals stored in the scan cells 210E to 230E to the first and second micro-bumps N_BUMP and T_BUMP, respectively, feedback the applied signals from the first and second micro-bumps N_BUMP and T_BUMP to the respective scan cells 210E to 230E, and sequentially output the signals stored in the scan cells 210E to 230E to the DA bumps/pads DAB/DAP, using the serial scan chain. Accordingly, the test circuit 210_1 to 230 may evaluate/verify the second micro-bumps T_BUMP as well as the first micro-bumps N_BUMP.

Meanwhile, the semiconductor device 200 may further include first to third AND gates AD2 to AD4, to generate signals for controlling the test circuit 210_1 to 230. The first AND gate AD2 may perform a logic AND operation on a mode signal DA_EN and a first test signal EXTEST_TX to output a first control signal DA_ENTX. The second AND gate AD3 may perform a logic AND operation on the mode signal DA_EN and a second test signal EXTEST_RX to output a second control signal DA_ENRX. The third AND gate AD4 may perform a logic AND operation on the mode signal DA_EN and a third test signal TM to output a third control signal DA_ENTM. The mode signal DA_EN may be activated to transfer the signals through the DA bumps/pads DAB/DAP from a direct access area (1146 of FIG. 3). The first test signal EXTEST_TX may be activated to apply the signals stored in the scan cells 210E to 230E to the first and second micro-bumps N_BUMP and T_BUMP, during a connectivity test operation for bump. The second test signal EXTEST_RX may be activated to feedback the applied signals from the first and second micro-bumps N_BUMP and T_BUMP to the respective scan cells 210E to 230E, during the connectivity test operation for bump. The third test signal TM may be activated to output the signals stored in the scan cells 210E to 230E to the DA pads DAP, during the connectivity test operation for bump.

The first testing circuits 210_1 to 210_m may be respectively coupled to the first micro-bumps N_BUMP. In response to the first control signal DA_ENTX, the first testing circuits 210_1 to 210_m may transfer normal signals CA and DQ0 to DQn through the first micro-bumps N_BUMP, or signals through the bumps/pads DAB/DAP. In response to a capture signal CAP, a shifting signal SH, and a shifting clock SCLK, the first testing circuits 210_1 to 210_m may store selected signals into the scan cells 210E by selecting one of the transferred signals and signals transferred from a testing circuit at a previous stage, or may output the signals stored in the scan cells 210E to a testing circuit at a next stage. In response to the first test signal EXTEST_TX, the first testing circuits 210_1 to 210_m may apply the signals stored in the scan cells 210E to the first micro-bumps N_BUMP. Except for a first testing circuit 210_1 at a first stage among the first testing circuits 210_1 to 210_m, the first testing circuits 210_2 to 210_m may have substantially the same configuration to each of the driving circuits 12_1 to 12_m of FIG. 4. Hereinafter, the configuration of the first test circuit 210_1 is described in detail.

The first testing circuit 210_1 may include a first input circuit 210A, a first multiplexer 210B, a second multiplexer 210C, a third multiplexer 210D, the scan cell 210E, a first test application circuit 210F, and a first output circuit 210G.

The first input circuit 210A may receive the normal signal CA through the first micro-bump N_BUMP. The first multiplexer 210B may select the normal signal CA provided from the first input circuit 210A, or the signal transferred through the DA bump/pad DAB/DAP, according to the first control signal DA_ENTX. The second multiplexer 210C may select a signal transferred from the second testing circuit 220 at a previous stage, or a serial input signal IWSI, according to the mode signal DA_EN. The second multiplexer 210C may select the signal transferred from the second testing circuit 220 when the mode signal DA_EN is activated. The third multiplexer 210D may select a signal transferred from the first multiplexer 210B, or a signal transferred from the second multiplexer 210C, according to the capture signal CAP and the shifting signal SH. The third multiplexer 210D may select the signal transferred from the second multiplexer 210C when the shifting signal SH is activated, and may select the signal transferred from the first multiplexer 210B when the capture signal CAP is activated. The scan cell 210E may store the selected signal from the third multiplexer 210D according to the shifting clock SCLK. Preferably, the scan cell 210E may be composed of D-flip-flop. The first test application circuit 210F may apply the signal stored in the scan cell 210E to the first output circuit 210G, when the first test signal EXTEST_TX is activated. The first output circuit 210G may output the applied signal from the first test application circuit 210F to the first micro-bump N_BUMP.

The second testing circuit 220 may be coupled to at least one test input bump of the second micro-bumps T_BUMP, for receiving the serial input signal WSI and the test control signal WSC, which are dedicated for input, among the test signals WSI, WSC and WSO. The second testing circuit 220 may include a second input circuit 220A, a fourth multiplexer 220B, a fifth multiplexer 220C, a sixth multiplexer 220D, a mode control circuit 220E, the scan cell 220F, a second test application circuit 220G, and a second output circuit 220H.

The second input circuit 220A may receive the test signal WSI or WSC through the test input bump T_BUMP. The fourth multiplexer 220B may select a signal transferred from the second input circuit 220A, or a level signal of a ground voltage VSS, according to the second control signal DA_ENRX. The fourth multiplexer 220B may select the signal transferred from the second input circuit 220A when the second control signal DA_ENRX is activated. The fifth multiplexer 220C may select a signal transferred from the second input circuit 220A, or a signal transferred through the bump/pad DAB/DAP, according to the mode signal DA_EN. The fifth multiplexer 220C may select the signal transferred through the bump/pad DAB/DAP when the mode signal DA_EN is activated. The mode control circuit 220E may decode the selected signal from the fifth multiplexer 220C, and generate the serial input signal IWSI, the capture signal CAP, the shifting signal SH and the shifting clock SCLK. The mode control circuit 220E may have substantially the same configuration as the mode control circuit 18CD of FIGS. 4 and 5.

The sixth multiplexer 220D may select a signal transferred from the fourth multiplexer 220B, or a signal transferred from the third testing circuit 230, according to the capture signal CAP and the shifting signal SH. The sixth multiplexer 220D may select the signal transferred from the third testing circuit 230 when the shifting signal SH is activated, and may select the signal transferred from the fourth multiplexer 220B when the capture signal CAP is activated. The scan cell 220F may store the selected from the sixth multiplexer 220D according to the shifting clock SCLK. The second test application circuit 220G may apply the signal stored in the scan cell 220F to the second output circuit 220H, when the first control signal DA_ENTX is activated. The second output circuit 220H may output the applied signal from the second test application circuit 220G to the test input bump T_BUMP.

The third testing circuit 230 may be coupled to the test output bump of the second micro-bumps T_BUMP, for receiving the serial output signal WSO, which is dedicated for output, among the test signals WSI, WSC, and WSO. The third testing circuit 230 may include a third input circuit 230A, a seventh multiplexer 230B, an eighth multiplexer 230C, a ninth multiplexer 230D, the scan cell 230E, a tenth multiplexer 230F, and a third output circuit 230G.

The third input circuit 230A may receive the test signal WSO through the test output bump T_BUMP. The seventh multiplexer 230B may select a signal transferred from the third input circuit 230A, or a signal (i.e., a signal of a first node ND1) transferred from the tenth multiplexer 230F, according to the third control signal DA_ENTM. The seventh multiplexer 230B may select the signal transferred from the third input circuit 230A when the third control signal DA_ENTM is deactivated. The seventh multiplexer 230B may select the signal of the first node ND1 when the third control signal DA_ENTM is activated. The eighth multiplexer 230C may select a signal transferred from the seventh multiplexer 230B, or a level signal of a ground voltage VSS, according to the mode signal DA_EN. The eighth multiplexer 230C may be coupled to the bump/pad DAB/DAP so as to output the signal transferred from the seventh multiplexer 230B to the bump/pad DAB/DAP when the mode signal DA_EN is activated. That is, the signal outputted from the eighth multiplexer 230C may be transferred to a test device (not shown) through the bump/pad DAB/DAP.

The ninth multiplexer 230D may select a signal transferred from the eighth multiplexer 230C, or the serial input signal IWSI, according to the capture signal CAP and the shifting signal SH. The ninth multiplexer 230D may select the serial input signal IWSI when the shifting signal SH is activated, and may select the signal transferred from the eighth multiplexer 230C when the capture signal CAP is activated. The scan cell 230E may store the selected from the ninth multiplexer 230D according to the shifting clock SCLK. The tenth multiplexer 230F may select the signal stored in the scan cell 230E, or a signal transferred from the first testing circuit 210_m at a last stage, among the first testing circuits 210_1 to 210_m, according to the first control signal DA_ENTX. The tenth multiplexer 230F may select the signal transferred from the first testing circuit 210_m and transfer the selected signal to the first node ND1, when the first control signal DA_ENTX is deactivated. The tenth multiplexer 230F may select the signal stored in the scan cell 230E and transfer the selected signal to the first node ND1, when the first control signal DA_ENTX is activated. The third test application circuit 230G may apply the signal of the first node ND1 when the first control signal DA_ENTX is activated. The third output circuit 230G may output the signal of the first node ND1 to the test output bump T_BUMP.

Hereinafter, referring to FIGS. 9 to 11D, a test operation of the semiconductor device 200 will be described in detail.

Figure 10:
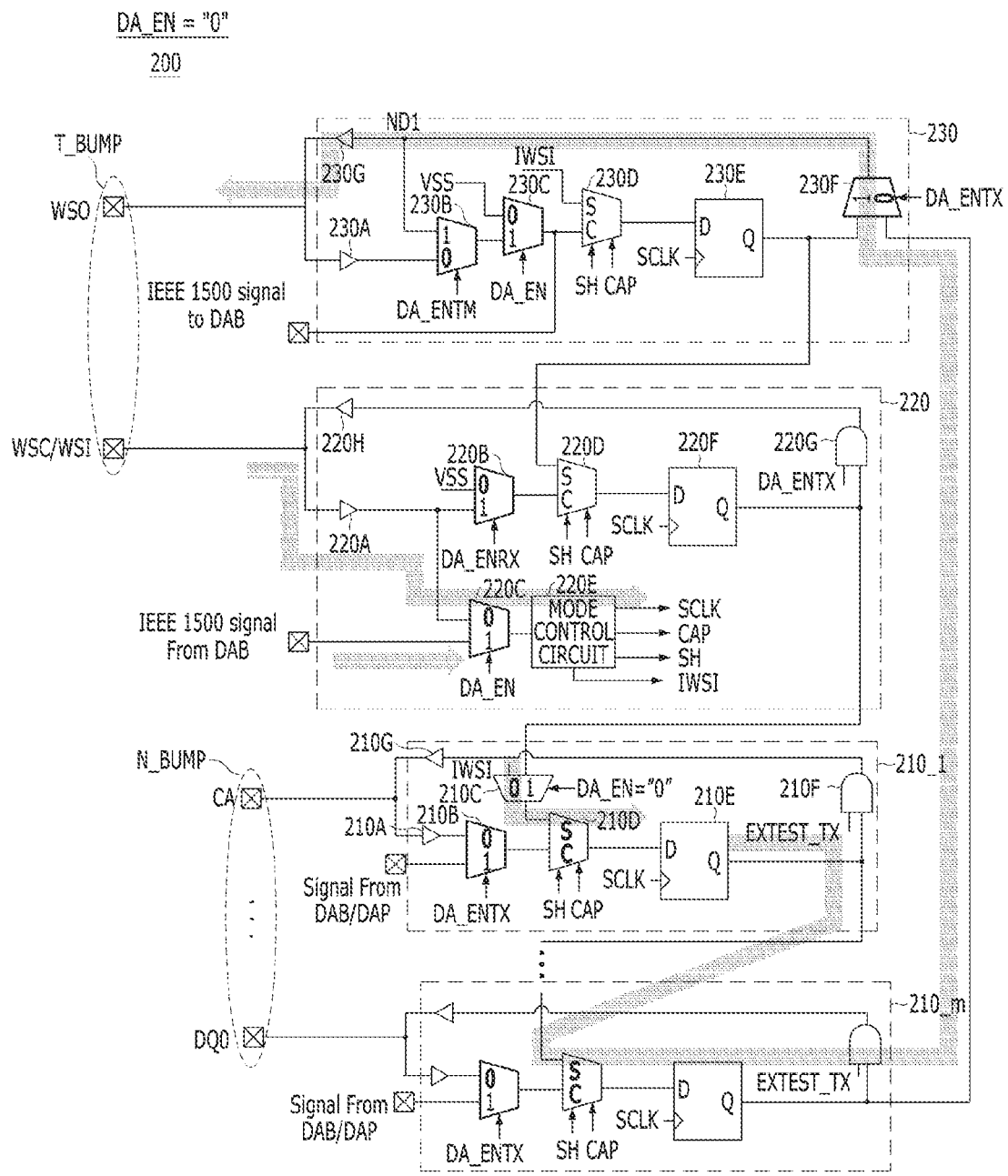
FIG. 10 is a diagram for describing a package-level test operation of the semiconductor device shown in FIG. 9.

FIG. 10 is a diagram for describing a package-level test operation of the semiconductor device 200 shown in FIG. 9, when the mode signal DA_EN is deactivated.

Referring to FIG. 10, when the mode signal DA_EN is deactivated, signals are transferred through the first micro-bumps N_BUMP and the second micro-bumps T_BUMP. Thus, the semiconductor device 200 may perform a normal operation or a test operation using the signals than are transferred through the first micro-bumps N_BUMP and the second micro-bumps T_BUMP from the controller (120 of FIG. 1).

During the test operation, the second testing circuit 220 may receive the test signals WSI and WSC through the second micro-bumps T_BUMP, and generate the serial input signal IWSI, the capture signal CAP, the shifting signal SH, and the shifting clock SCLK. The first testing circuit 210_1 at a first stage among the first testing circuits 210_1 to 210_m may select and receive the serial input signal IWSI according to the deactivated mode signal DA_EN. In response to the shifting signal SH and the shifting clock SCLK, the first testing circuits 210_1 to 210_m may sequentially store the serial input signal IWSI into the scan cells 210E. In response to the capture signal CAP and the shifting clock SCLK, the first testing circuits 210_1 to 210_m may simultaneously store the signals inputted through the first micro-bumps N_BUMP, into the scan cells 210E. Thereafter, in response to the shifting signal SH and the shifting clock SCLK, the first testing circuits 210_1 to 210_m may output the signals stored in the scan cells 210E. The third testing circuit 230 may output the signal transferred from the first testing circuit 210_m at a last stage among the first testing circuits 210_1 to 210_m, to the test output bump T_BUMP, as the serial output signal WSO. The controller 120 may monitor the semiconductor device 200 based on the serial output signal WSO.

Meanwhile, a package-level test operation of the semiconductor device 200 when the mode signal DA_EN is activated, may be performed in substantially the same way as a wafer-level test operation, except that signals are inputted/outputted through the DA bumps DAB in the package-level test operation.

FIGS. 11A to 11D are diagrams for describing a wafer-level test operation of the semiconductor device 200 shown in FIG. 9.

The first micro-bumps N_BUMP and the second micro-bumps T_BUMP might not be used at the wafer level, so that signals are inputted/outputted through only the DA pads DAP. Thus, the semiconductor device 200 may perform a test operation using the signals are transferred through the DA pads DAP, from a test device (not shown).

Figure 11A:
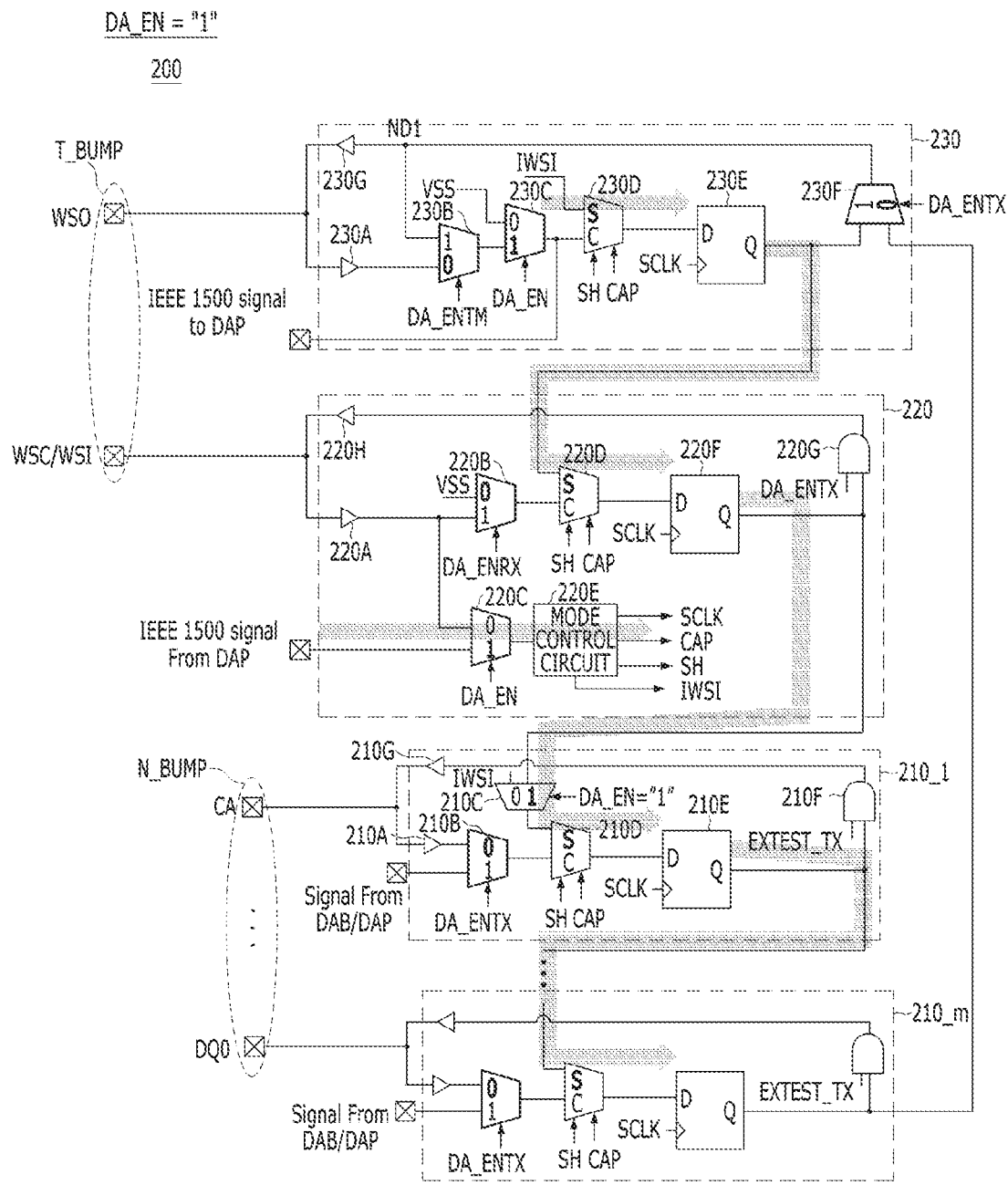
FIGS. 11A to 11D are diagrams for describing a wafer-level test operation of the semiconductor device shown in FIG. 9.

Referring to FIG. 11A, the mode signal DA_EN is activated, and the first to third control signals DA_ENTX, DA_ENRX, and DA_ENTM are deactivated. The second testing circuit 220 may receive the signals through the DA pads DAP, and generate the serial input signal IWSI, the capture signal CAP, the shifting signal SH, and the shifting clock SCLK. The first testing circuit 210_1 may select and receive the signal transferred from the second testing circuit 220, according to the activated mode signal DA_EN. Accordingly, the first to third testing circuits 210_1 to 230 may sequentially store the signals signal transferred from the second testing circuit 220, into the scan cells 210E to 230E, in response to the shifting signal SH and the shifting clock SCLK.

Figure 11B:
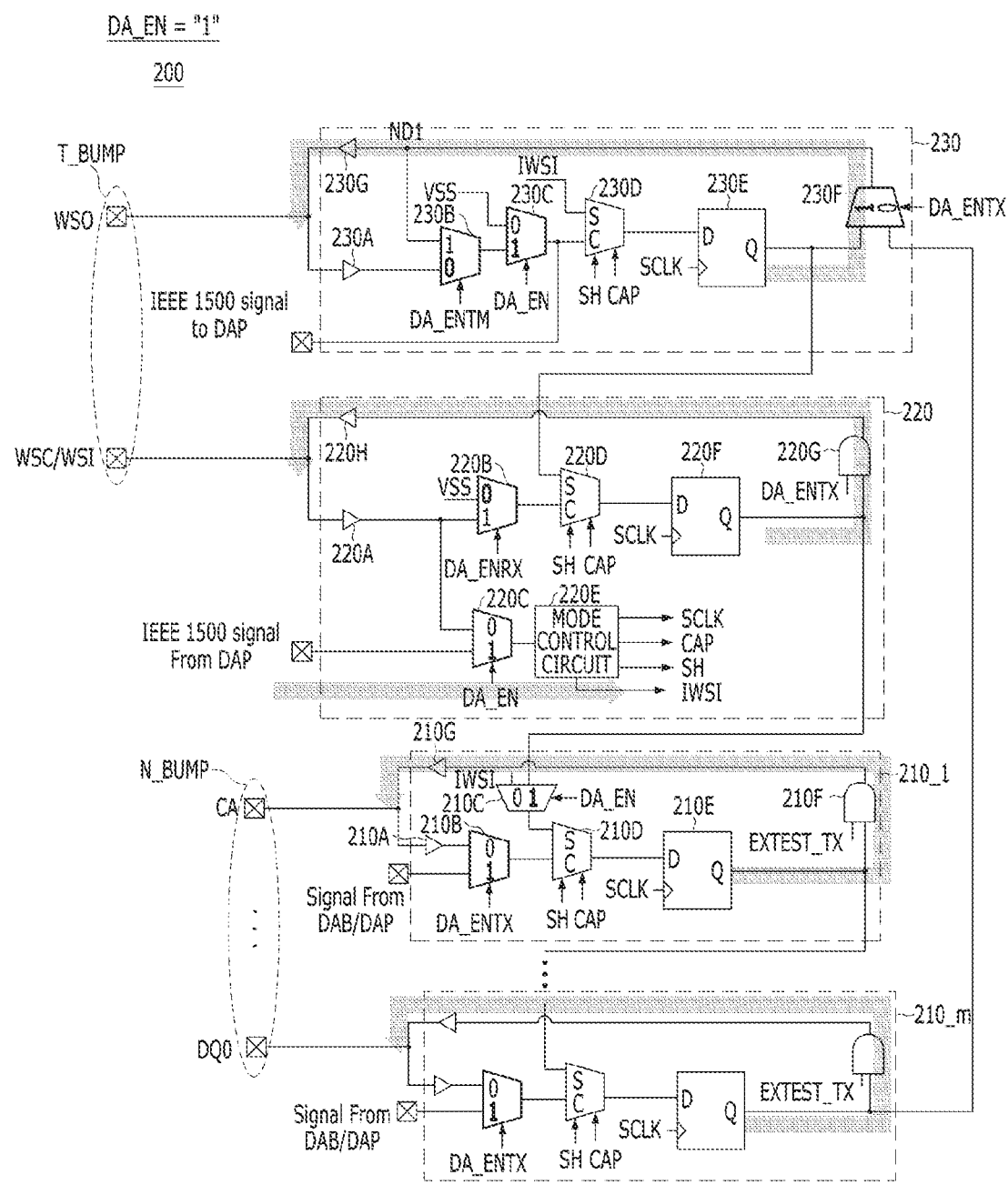

Referring to FIG. 11B, in a state that the mode signal DA_EN is activated, the first test signal EXTEST_TX is activated, and thus the first control signal DA_ENTX is activated. The first to third testing circuits 210_1 to 230 may transfer the signals stored in the scan cells 210E to 230E to the first micro-bumps N_BUMP and the second micro-bumps T_BUMP, through the first to third output circuits 210G, 220H, and 230G. That is, the signals stored in the scan cells 210E to 230E may be applied to the first micro-bumps N_BUMP and the second micro-bumps T_BUMP.

Figure 11C:
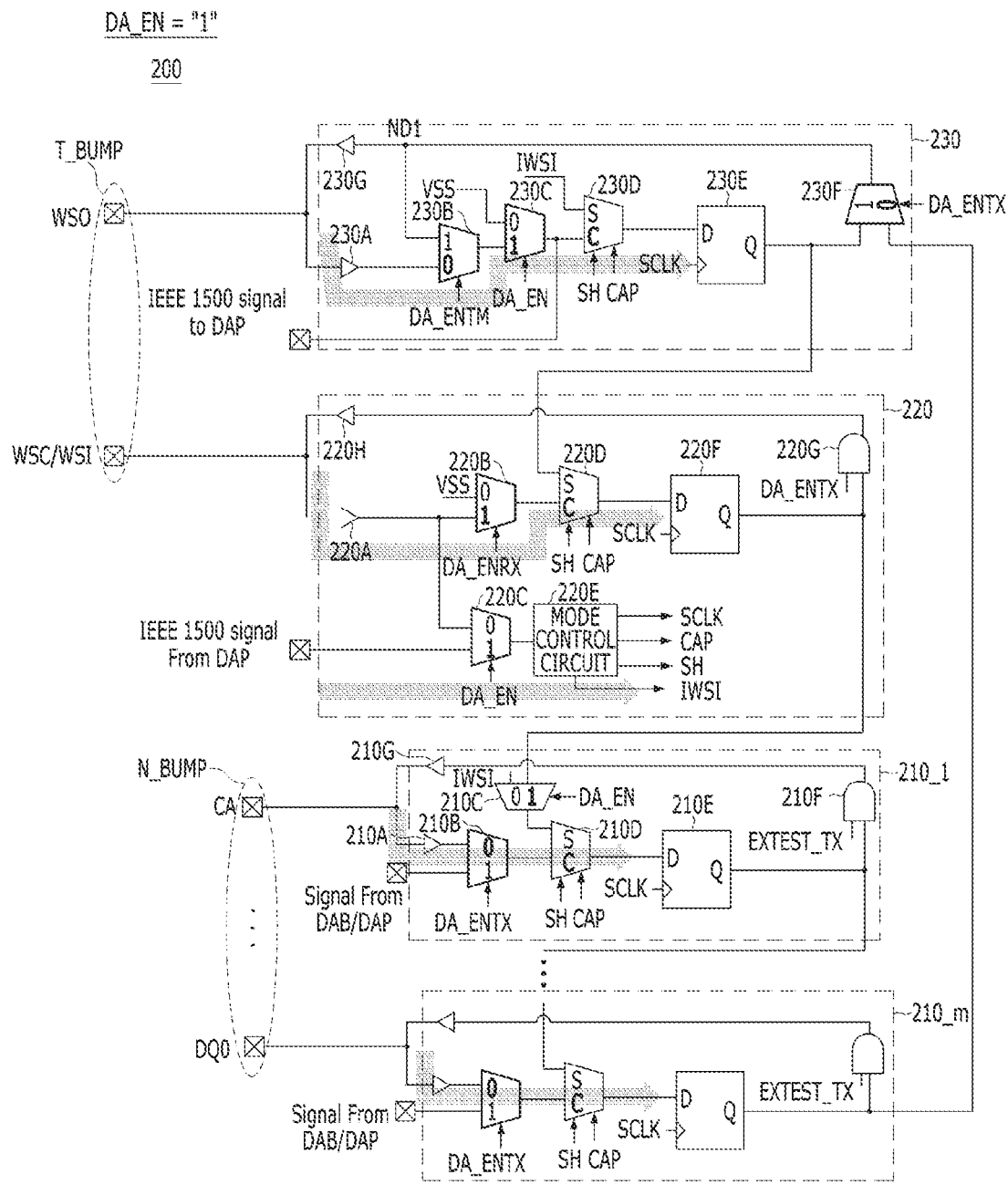

Referring to FIG. 11C, in a state that the mode signal DA_EN is activated, the second test signal EXTEST_RX is activated, and thus the second control signal DA_ENRX is activated. The first to third testing circuits 210_1 to 230 may simultaneously store the signals applied to the first micro-bumps N_BUMP and the second micro-bumps T_BUMP, into the scan cells 210E to 230E, according to the capture signal CAP and the shifting clock SCLK, through the first to third input circuits 210A, 220A, and 230A.

Figure 11D:
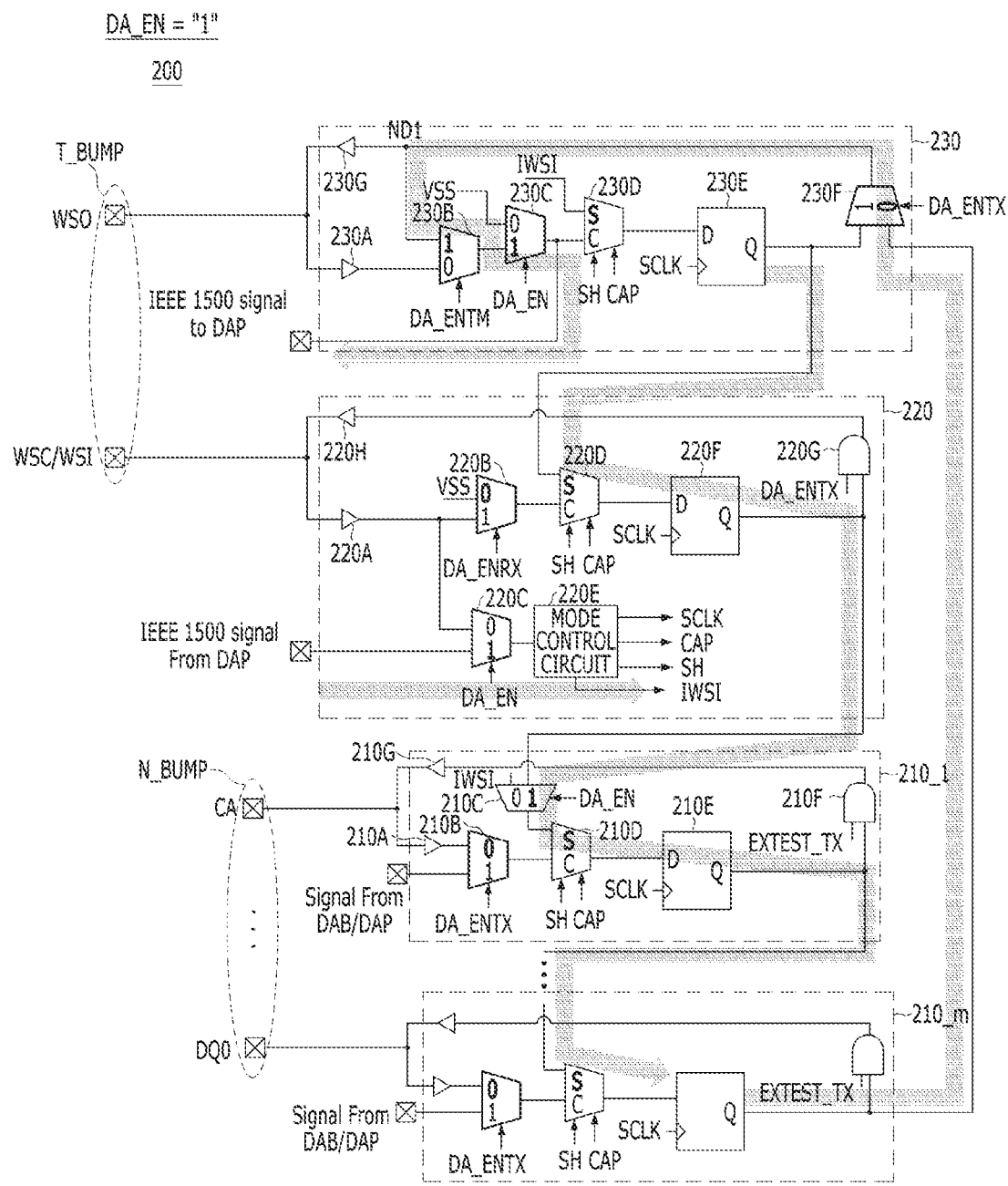

Referring to FIG. 11D, in a state that the mode signal DA_EN is activated, the third test signal EXTEST_TM is activated, and thus the third control signal DA_ENTM is activated. The first to third testing circuits 210_1 to 230 may sequentially output the signals stored in the scan cells 210E to 230E, according to the shifting signal SH and the shifting clock SCLK. In detail, a signal is transferred through a serial scan chain, in which the scan cell 230E of the third testing circuit 230, the scan cell 220F of the second testing circuit 220, and the scan cells 210E of the first testing circuits 210_1 to 210_m are formed, to the tenth multiplexer 230F. the tenth multiplexer 230F may select the signal transferred from the serial scan chain and transfer the selected signal to the first node ND1, according to the deactivated first control signal DA_ENTX is deactivated. The seventh multiplexer 230B may select the signal of the first node ND1, according to the activated third control signal DA_ENTM. The eighth multiplexer 230C may select the signal from the seventh multiplexer 230B, and output the selected signal to the DA pad DAP according to the activated mode signal DA_EN. Because the test device knows the value of the serial input signal WSI it provides, so it can determine whether the connectivity of the first micro-bumps N_BUMP and the second micro-bumps T_BUMP is pass or fail by monitoring the signals transmitted through the DA pads DAP.

According to the embodiments of the present teachings, the semiconductor device may improve the reliability of the test operation and the test performance thereof by evaluating/verifying a connectivity of not only normal bumps but also test bumps.

While the present teachings have been described with respect to the specific embodiments, it will be apparent to those skilled in the art that various changes and modifications may be made without departing from the spirit and scope of the present teachings as defined in the following claims.

For example, the logic gates and transistors described in the above embodiments may have different positions and types according to the polarity of input signals.

What is claimed is:

1. A semiconductor device, comprising:
   a plurality of first micro-bumps suitable for transferring normal signals;
   a plurality of second micro-bumps suitable for transferring test signals; and
   a test circuit including a plurality of scan cells respectively corresponding to the first and second micro-bumps, the test circuit suitable for:
   applying signals stored in the respective scan cells to the first and second micro-bumps;
   feeding back the applied signals from the first and second micro-bumps to the respective scan cells; and
   sequentially outputting the signals stored in the scan cells to a test output pad.

2. The semiconductor device of claim 1,
   wherein the first micro-bumps include normal bumps for inputting/outputting a command/address and data, and
   wherein the second micro-bumps include at least one test input bump for receiving a serial input signal and a test control signal, and a test output bump for outputting a serial output signal.

3. The semiconductor device of claim 2, wherein the at least one test input bump is suitable for receiving a serial input signal and a test control signal for embedded core testing, and the test output bump is suitable for outputting a serial output signal for embedded core testing, according to IEEE 1500 standard.

4. The semiconductor device of claim 2, wherein the test circuit includes:
   a plurality of first testing circuits respectively coupled to the normal bumps;
   a second testing circuit coupled to the at least one test input bump; and
   a third testing circuit coupled to the test output bump.

5. The semiconductor device of claim 4, wherein each of the first testing circuits includes:
   a first input circuit suitable for receiving a signal through a corresponding first micro-bump;
   a first multiplexer suitable for selecting the signal provided from the first input circuit, or a signal transferred through a test input pad, according to a first control signal;
   a third multiplexer suitable for selecting a signal transferred from the first multiplexer, or a signal transferred from a previous testing circuit, according to a capture signal and a shifting signal;
   the scan cell suitable for storing a signal transferred from the third multiplexer, according to a shifting clock;
   a first test application circuit suitable for applying a signal stored in the scan cell, when a first test signal is activated; and
   a first output circuit suitable for outputting a signal applied from the first test application circuit to the corresponding first micro-bump.

6. The semiconductor device of claim 5, wherein a testing circuit at a first stage among the first testing circuits, further includes:
a second multiplexer suitable for selecting a signal transferred from the second testing circuit, or the serial input signal, according to a mode signal,
wherein the third multiplexer is suitable for selecting the signal transferred from the first multiplexer, or a signal transferred from the second multiplexer, according to the capture signal and the shifting signal.

7. The semiconductor device of claim 4, wherein the second testing circuit includes:
a second input circuit suitable for receiving a signal through the at least one test input bump;
a fourth multiplexer suitable for selecting a signal transferred from the second input circuit, or a level signal of a ground voltage, according to a second control signal;
a fifth multiplexer suitable for selecting a signal transferred from the second input circuit, or a signal transferred through a test input pad, according to a mode signal;
a sixth multiplexer suitable for selecting a signal transferred from the fourth multiplexer, or a signal transferred from the third testing circuit, according to a capture signal and a shifting signal;
the scan cell suitable for storing a signal transferred from the sixth multiplexer, according to a shifting clock;
a second test application circuit suitable for applying a signal stored in the scan cell, when a first test signal is activated; and
a second output circuit suitable for outputting a signal applied from the second test application circuit to the at least one test input bump.

8. The semiconductor device of claim 7, wherein the second testing circuit further includes:
a mode control circuit suitable for decoding a signal transferred from the fifth multiplexer, and generate an internal serial input signal, the capture signal, the shifting signal and the shifting clock.

9. The semiconductor device of claim 4, wherein the third testing circuit includes:
a third input circuit suitable for receiving a signal through the test output bump;
a seventh multiplexer suitable for selecting a signal transferred from the third input circuit, or a signal of a first node, according to a third control signal;
an eighth multiplexer suitable for selecting a signal transferred from the seventh multiplexer, or a level signal of a ground voltage, according to a mode signal;
a ninth multiplexer suitable for selecting a signal transferred from the eighth multiplexer, or the serial input signal, according to a capture signal and a shifting signal;
the scan cell suitable for storing a signal transferred from the ninth multiplexer, according to a shifting clock;
a tenth multiplexer suitable for selecting a signal stored in the scan cell, or a signal transferred from a testing circuit at a last stage among the first testing circuits, to apply the selected signal to the first node, according to a first control signal; and
a third output circuit suitable for outputting the signal of the first node to the test output bump,
wherein the signal transferred from the eighth multiplexer is provided to the test output pad.

10. The semiconductor device of claim 1,
wherein the semiconductor device includes a physical area suitable for interfacing with a controller, and a direct access area suitable for interfacing with a test device,
wherein the physical area includes a channel interface area suitable for interfacing with the controller, and a middle physical area suitable for interfacing with the direct access area, and
wherein the first micro-bumps are disposed in the channel interface area, and the second micro-bumps are disposed in the middle physical area.

11. The semiconductor device of claim 10, wherein the direct access area includes:
a bump area on which a plurality of micro-bumps suitable for interfacing with the test device to test the semiconductor device of a package level are formed; and
a proving area on which a plurality of pads suitable for interfacing with the test device to test the semiconductor device of a wafer level are formed.

12. The semiconductor device of claim 11, wherein the test circuit is suitable for:
sequentially storing signals transferred from the pads of the proving area, into the scan cells,
applying signals stored in the respective scan cells to the micro-bumps of the bump area, and feeding back the applied signals from the micro-bumps to the respective scan cells, and
sequentially outputting the signals stored in the scan cells to the pads of the proving area.

13. A semiconductor device, comprising:
a plurality of first micro-bumps suitable for transferring normal signals;
a plurality of second micro-bumps suitable for transferring test signals;
a plurality of first testing circuits respectively coupled to the first micro-bumps;
a second testing circuit coupled to at least one test input bump among the second micro-bumps; and
a third testing circuit coupled to a test output bump among the second micro-bumps,
wherein the first to third testing circuits include a plurality of scan cells respectively coupled to the first and second micro-bumps, and the scan cells form a serial scan chain in the order of the third testing circuit, then the second testing circuit, and then the first testing circuits.

14. The semiconductor device of claim 13,
wherein the semiconductor device includes a physical area suitable for interfacing with a controller, and a direct access area suitable for interfacing with a test device,
wherein the physical area includes a channel interface area suitable for interfacing with the controller, and a middle physical area suitable for interfacing with the direct access area, and
wherein the first micro-bumps are disposed in the channel interface area, and the second micro-bumps are disposed in the middle physical area.

15. The semiconductor device of claim 14, wherein the direct access area includes:
a bump area on which a plurality of micro-bumps suitable for interfacing with the test device to test the semiconductor device of a package level are formed; and
a proving area on which a plurality of pads suitable for interfacing with the test device to test the semiconductor device of a wafer level are formed.

16. The semiconductor device of claim 15, wherein the first to third test circuits are suitable for:
- sequentially storing signals transferred from the pads of the proving area, into the scan cells through the serial scan chain,
- applying signals stored in the respective scan cells to the micro-bumps of the bump area, and feeding back the applied signals from the micro-bumps to the respective scan cells, and
- sequentially outputting the signals stored in the scan cells through the serial scan chain, to the pads of the proving area.

17. A method of testing a semiconductor device in which a plurality of normal micro-bumps, a plurality of test micro-bumps, and a plurality of scan cells respectively corresponding to the normal micro-bumps and the test micro-bumps, and forming a serial scan chain, are formed, the method comprising:
- sequentially storing signals transferred from a proving area on which a plurality of pads are formed, into the scan cells through the serial scan chain;
- applying signals stored in the respective scan cells to the corresponding micro-bumps disposed on a bump area;
- feeding back the applied signals from the micro-bumps to the respective scan cells; and
- sequentially outputting the signals stored in the scan cells through the serial scan chain, to the pads of the proving area.

18. The method of claim 17, further comprising testing the semiconductor device of a wafer level using a test device interfaced with the plurality of pads disposed in the proving area.

19. The method of claim 17, further comprising receiving, by the test micro-bumps which include at least one test input bump, a serial input signal and a test control signal, and outputting, by a test output bump of the semiconductor device, a serial output signal.

20. The method of claim 19, further comprising receiving, by the at least one test input bump, a serial input signal and a test control signal for embedded core testing, and outputting, by the test output bump, a serial output signal for embedded core testing, according to IEEE 1500 standard.

\* \* \* \* \*